(12) United States Patent
Han

(10) Patent No.: US 12,181,802 B2
(45) Date of Patent: Dec. 31, 2024

(54) SEMICONDUCTOR DEVICES

(71) Applicant: Samsung Electronics Co., Ltd., Suwon-si (KR)

(72) Inventor: Minchul Han, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 524 days.

(21) Appl. No.: 17/669,441

(22) Filed: Feb. 11, 2022

(65) Prior Publication Data

US 2022/0299887 A1 Sep. 22, 2022

(30) Foreign Application Priority Data

Mar. 16, 2021 (KR) ........................ 10-2021-0034242

(51) Int. Cl.
*G03F 7/00* (2006.01)
*H01L 23/544* (2006.01)

(52) U.S. Cl.
CPC ........ *G03F 7/70633* (2013.01); *H01L 23/544* (2013.01)

(58) Field of Classification Search
CPC ............................ G03F 7/70633; H01L 23/544
See application file for complete search history.

(56) References Cited

U.S. PATENT DOCUMENTS

| | | | |
|---|---|---|---|
| 6,172,409 B1 | 1/2001 | Zhou | |
| 6,261,883 B1 | 7/2001 | Koubuchi et al. | |
| 6,514,851 B2 | 2/2003 | Saito | |
| 7,408,642 B1* | 8/2008 | DiBiase | G03F 7/70633 356/399 |
| 9,184,136 B2 | 11/2015 | Kim et al. | |
| 9,711,395 B2* | 7/2017 | Kim | H01L 27/0207 |
| 2011/0156286 A1* | 6/2011 | Ushida | G03F 9/7084 257/E23.179 |
| 2016/0307850 A1* | 10/2016 | Lin | G03F 7/70633 |
| 2020/0057388 A1* | 2/2020 | Sun | G03F 7/7065 |
| 2022/0216162 A1* | 7/2022 | Park | H01L 23/544 |

FOREIGN PATENT DOCUMENTS

| | | |
|---|---|---|
| JP | 3587712 B2 | 8/2004 |
| KR | 20010036817 A | 5/2001 |
| KR | 100289662 B1 | 7/2001 |

* cited by examiner

*Primary Examiner* — Michael Jung
(74) *Attorney, Agent, or Firm* — Myers Bigel, P.A.

(57) ABSTRACT

A semiconductor device includes a substrate including a cell region and a scribe lane surrounding the cell region, a first overlay pattern structure, which is on the scribe lane and includes first sub-patterns extending in a first direction parallel to an upper surface of the substrate, second sub-patterns extending in a second direction parallel to the upper surface of the substrate, a first outer fence surrounding the first sub-patterns and the second sub-patterns in a plan view and defining a first overlay pattern region, and a first inner fence in the first overlay pattern region and between the first sub-patterns and the second sub-patterns, and a lower structure in the cell region and on the scribe lane and between the first sub-patterns, the second sub-patterns, the first outer fence, and the first inner fence.

20 Claims, 23 Drawing Sheets

SEMICONDUCTOR DEVICES

CROSS-REFERENCE TO RELATED APPLICATION

This application is based on and claims priority under 35 U.S.C. § 119 to Korean Patent Application No. 10-2021-0034242, filed on Mar. 16, 2021, in the Korean Intellectual Property Office, the disclosure of which is incorporated by reference herein in its entirety.

BACKGROUND

The present disclosure relates to semiconductor devices. To manufacture a semiconductor device, a pattern of a material layer is formed on a semiconductor wafer through a lithography process. When the lithography process is repeatedly performed, an overlay pattern may be used to match a location of a pattern formed during a previous process with a location of a pattern formed during a present process. However, as the number of stacked material layers increases because of the high integration of a semiconductor device, an upper-level difference may occur between an overlay pattern and a portion around the overlay pattern and, accordingly, defects may be caused in a subsequent process of the semiconductor device.

SUMMARY

The inventive concept provides a semiconductor device including an overlay pattern used to prevent/reduce a gap between the overlay pattern and a level of an upper surface around the overlay pattern.

According to an aspect of the inventive concept, there is provided a semiconductor device including a substrate including a cell region and a scribe lane surrounding the cell region, a first overlay pattern structure, which is on the scribe lane and includes first sub-patterns extending in a first direction parallel to an upper surface of the substrate, second sub-patterns extending in a second direction parallel to the upper surface of the substrate, a first outer fence surrounding the first sub-patterns and the second sub-patterns in a plan view and defining a first overlay pattern region, and a first inner fence in the first overlay pattern region and between the first sub-patterns and the second sub-patterns, and a lower structure in the cell region and on the scribe lane and between the first sub-patterns, the second sub-patterns, the first outer fence, and the first inner fence.

According to an aspect of the inventive concept, there is provided a semiconductor device including a substrate including a cell region and a scribe lane surrounding the cell region, a lower structure in the cell region and on the scribe lane and including a first insulating layer and a second insulating layer on the first insulating layer, a first overlay pattern structure, which is on the scribe lane and includes a plurality of first overlay patterns extending in a first direction parallel to an upper surface of the substrate and spaced apart from each other in a second direction parallel to the upper surface of the substrate, a first outer fence surrounding the plurality of first overlay patterns in a plan view, defining a first overlay pattern region, penetrating the first and second insulating layers, and extending in a third direction perpendicular to the upper surface of the substrate, and a second overlay pattern structure, which is on the scribe lane and includes a plurality of second overlay patterns extending in the first direction parallel to the upper surface of the substrate and spaced apart from each other in the second direction, and in the plan view, a second outer fence surrounding the plurality of second overlay patterns, defining a second overlay pattern region, penetrating the first and second insulating layers, and extending in the third direction.

According to an aspect of the inventive concept, there is provided a semiconductor device including a substrate including a cell region and a scribe lane surrounding the cell region, a peripheral circuit transistor in the cell region, a lower structure on the peripheral circuit transistor in the cell region and on the scribe lane and including a first insulating layer and a second insulating layer on the first insulating layer, a memory cell array on the lower structure in the cell region, a first overlay pattern structure, which is on the scribe lane and includes a plurality of first overlay patterns extending in a first direction parallel to an upper surface of the substrate and spaced apart from each other in a second direction parallel to the upper surface of the substrate, and, in a plan view, a first outer fence surrounding the plurality of first overlay patterns, defining a first overlay pattern region, penetrating the first and second insulating layers, and extending in a third direction perpendicular to the upper surface of the substrate, and a second overlay pattern structure, which is on the scribe lane and includes a plurality of second overlay patterns extending in the first direction parallel to the upper surface of the substrate and spaced apart from each other in the second direction, and in the plan view, a second outer fence surrounding the plurality of second overlay patterns, defining a second overlay pattern region, penetrating the first and second insulating layers, and extending in the third direction.

BRIEF DESCRIPTION OF THE DRAWINGS

Embodiments of the inventive concept will be more clearly understood from the following detailed description taken in conjunction with the accompanying drawings in which.

DETAILED DESCRIPTION

Hereinafter, one or more embodiments of the inventive concept will be described in detail with reference to the attached drawings.

Figure 1:
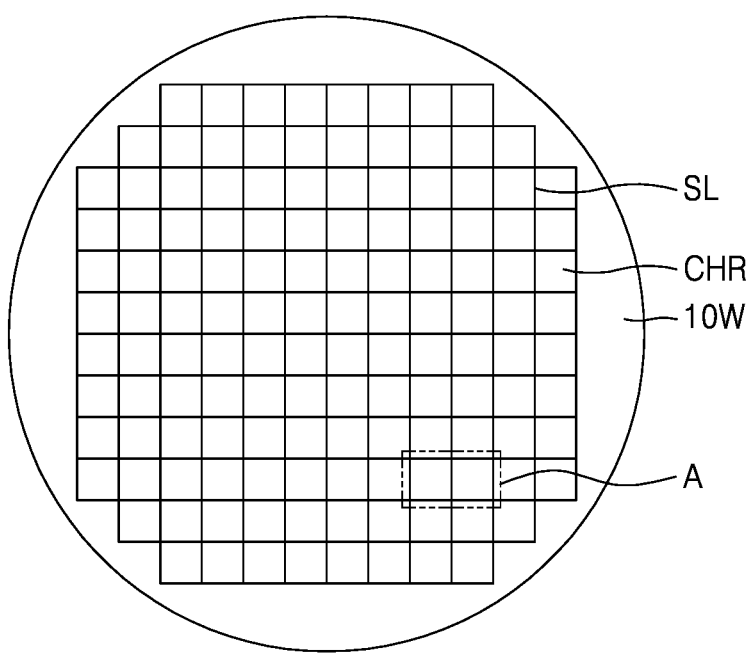
FIG. 1 is a plan view of a semiconductor wafer for forming a semiconductor device, according to example embodiments.
Figure 2:
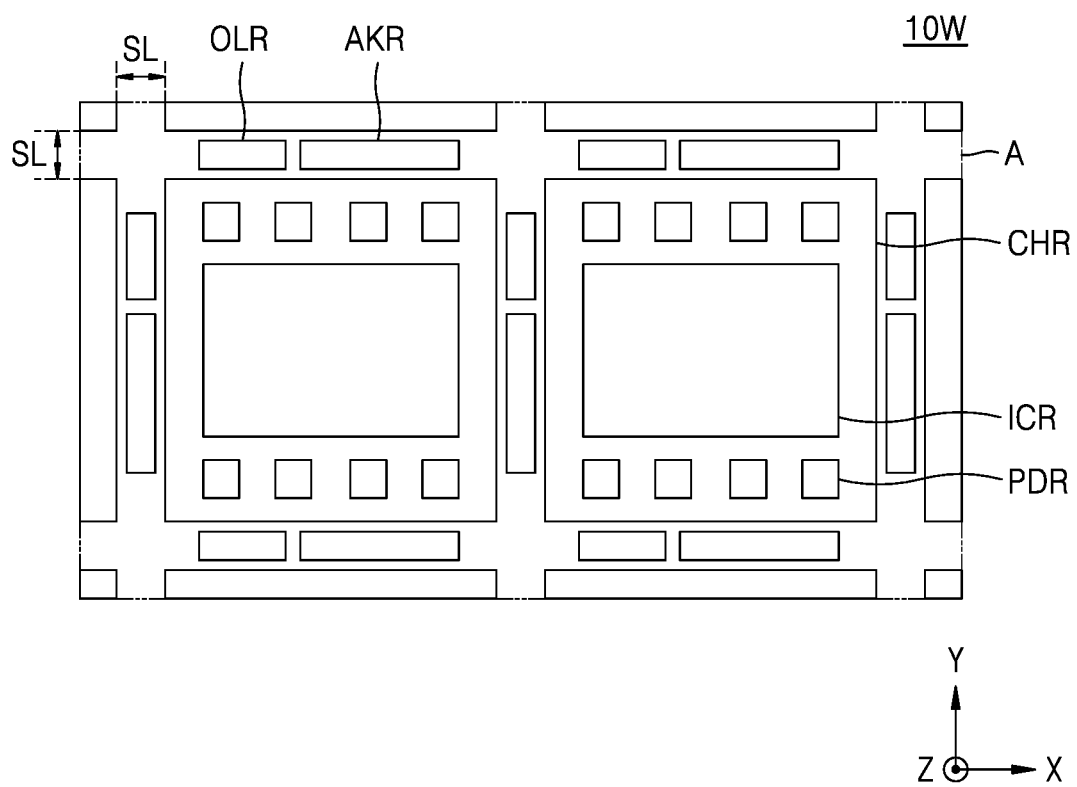
FIG. 2 is an enlarged view of a region A of FIG. 1.

FIG. 1 is a plan view of a semiconductor wafer 10W for forming a semiconductor device according to example embodiments. FIG. 2 is an enlarged view of a region A of FIG. 1.

Referring to FIGS. 1 and 2, the semiconductor wafer 10W may include cell regions CHR and scribe lanes (or scribe lines) SL surrounding the cell regions CHR. In a plan view, the scribe lanes SL may be arranged between the cell regions CHR, and the cell regions CHR may be defined by the scribe lanes SL. Each cell region CHR may be a semiconductor chip region where the semiconductor wafer 10W is sawed along the scribe lanes SL and singulated into semiconductor devices 100 (see FIG. 3) or separated therefrom in a subsequent process.

Each cell region CHR may include a circuit region ICR and an input/output device region PDR. The circuit region ICR may be a region where memory devices and/or logic devices are formed. For example, the circuit region ICR may be a region where a memory cell array MCA (see FIG. 3) and a peripheral circuit transistor TR (see FIG. 3) are formed.

In some embodiments, overlay pattern regions OLR and alignment key regions AKR may be arranged on the semiconductor wafer 10W. For example, the overlay pattern regions OLR and the alignment key regions AKR may be arranged on the scribe lanes SL. On the scribe lanes SL, the overlay pattern regions OLR and the alignment key regions AKR may be apart from each other at certain intervals.

The overlay pattern regions OLR may each be a region where an overlay pattern is formed, and the alignment key regions AKR may each be a region where an alignment key pattern is formed. In the present specification, the term "overlay pattern" may indicate a photo key pattern used to align a location of a photoresist pattern used in one manufacturing process with a location of a photoresist pattern used in a subsequent manufacturing process, and the term "alignment key pattern" may indicate a photo key pattern used to align a location of the semiconductor wafer 10W to a photolithography device in one manufacturing process. The term "photo key pattern" may include both an overlay pattern and an alignment key pattern and may also include other components having functions similar to those of the overlay and alignment key patterns.

Figure 3:
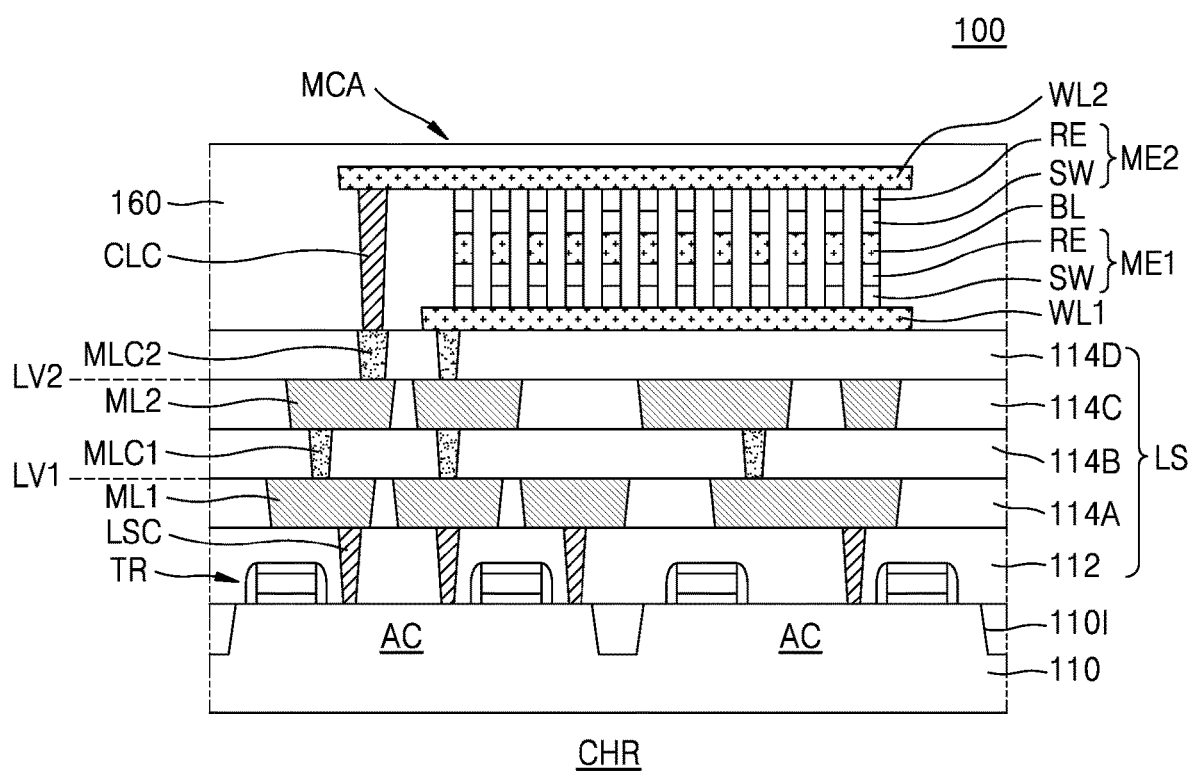
FIG. 3 is a cross-sectional view of a semiconductor device according to example embodiments.
Figure 4:
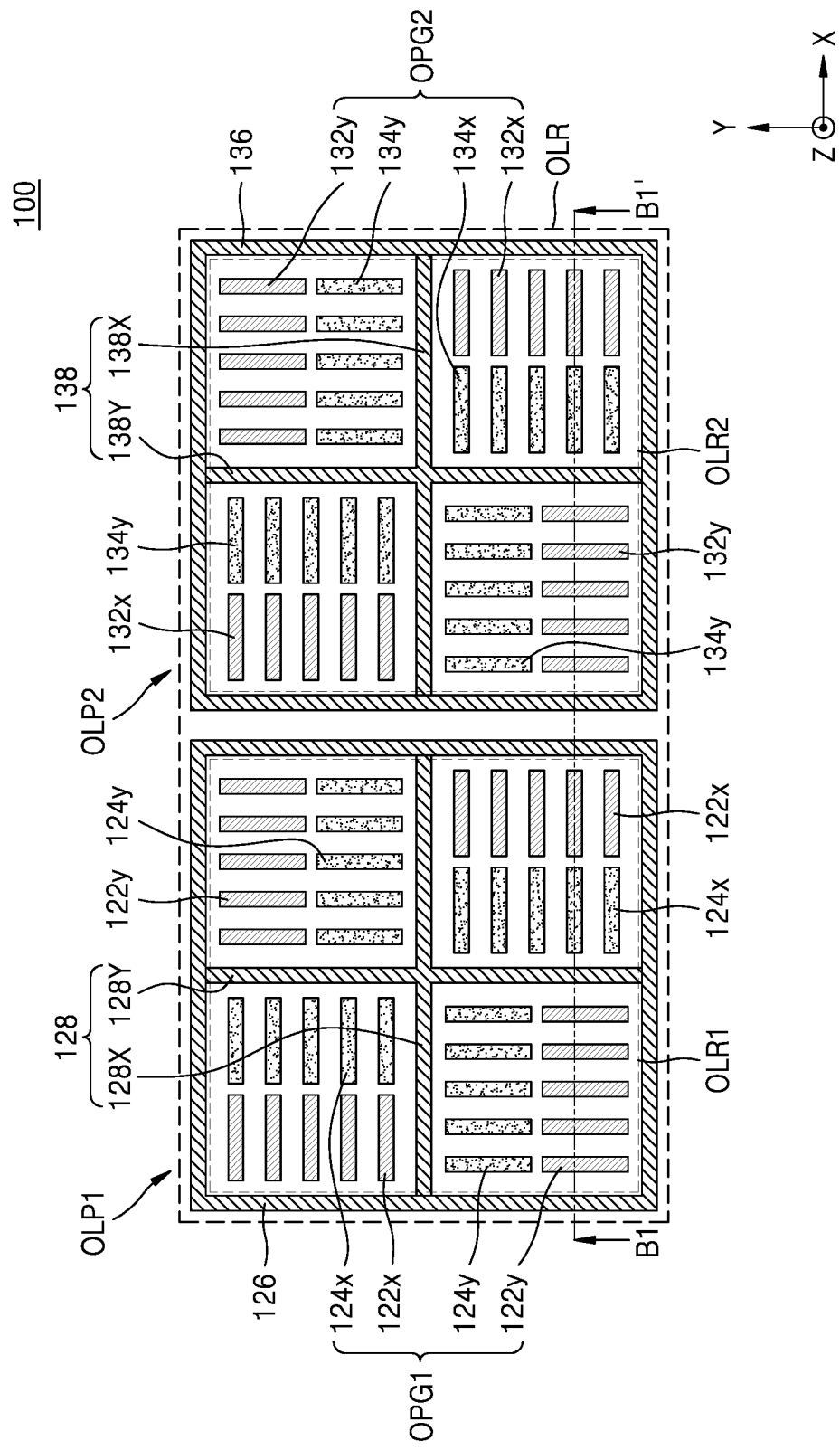
FIG. 4 is a layout illustrating an overlay pattern region of a semiconductor pattern according to example embodiments.
Figure 5:
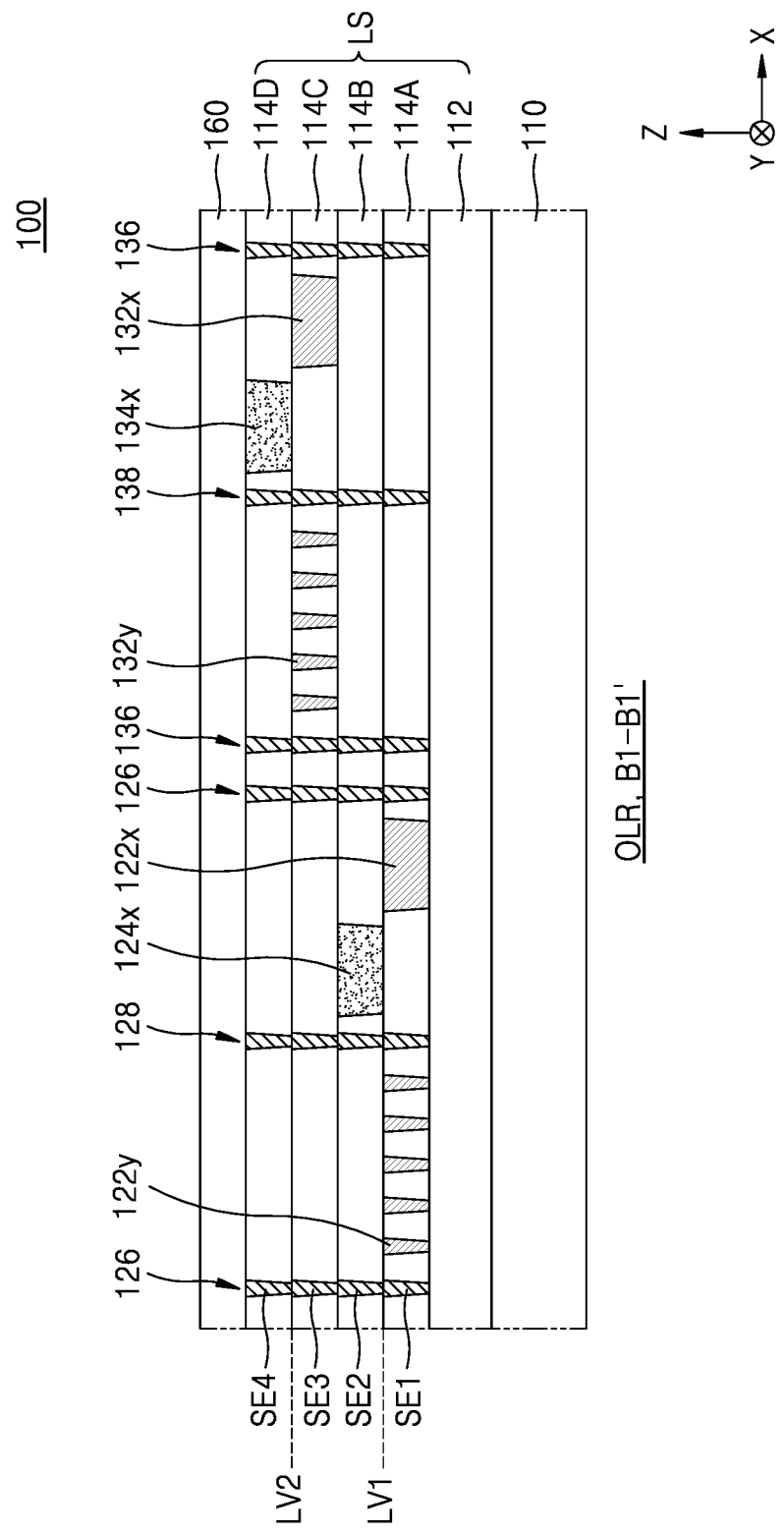
FIG. 5 is a cross-sectional view taken along a line B1-B1' of FIG. 4.
Figure 6:
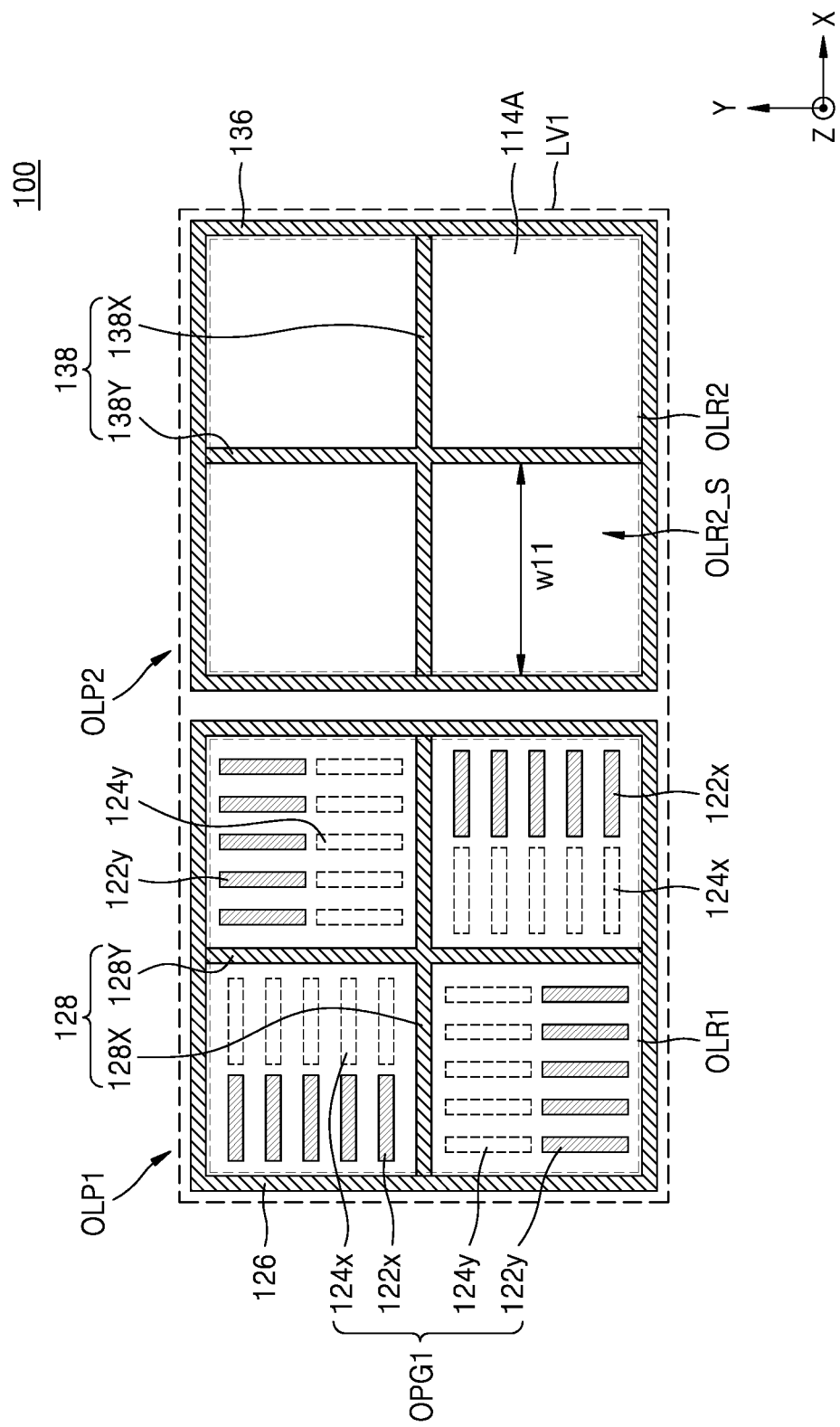
FIG. 6 is a horizontal cross-sectional view at a first vertical level of FIG. 5.
Figure 7:
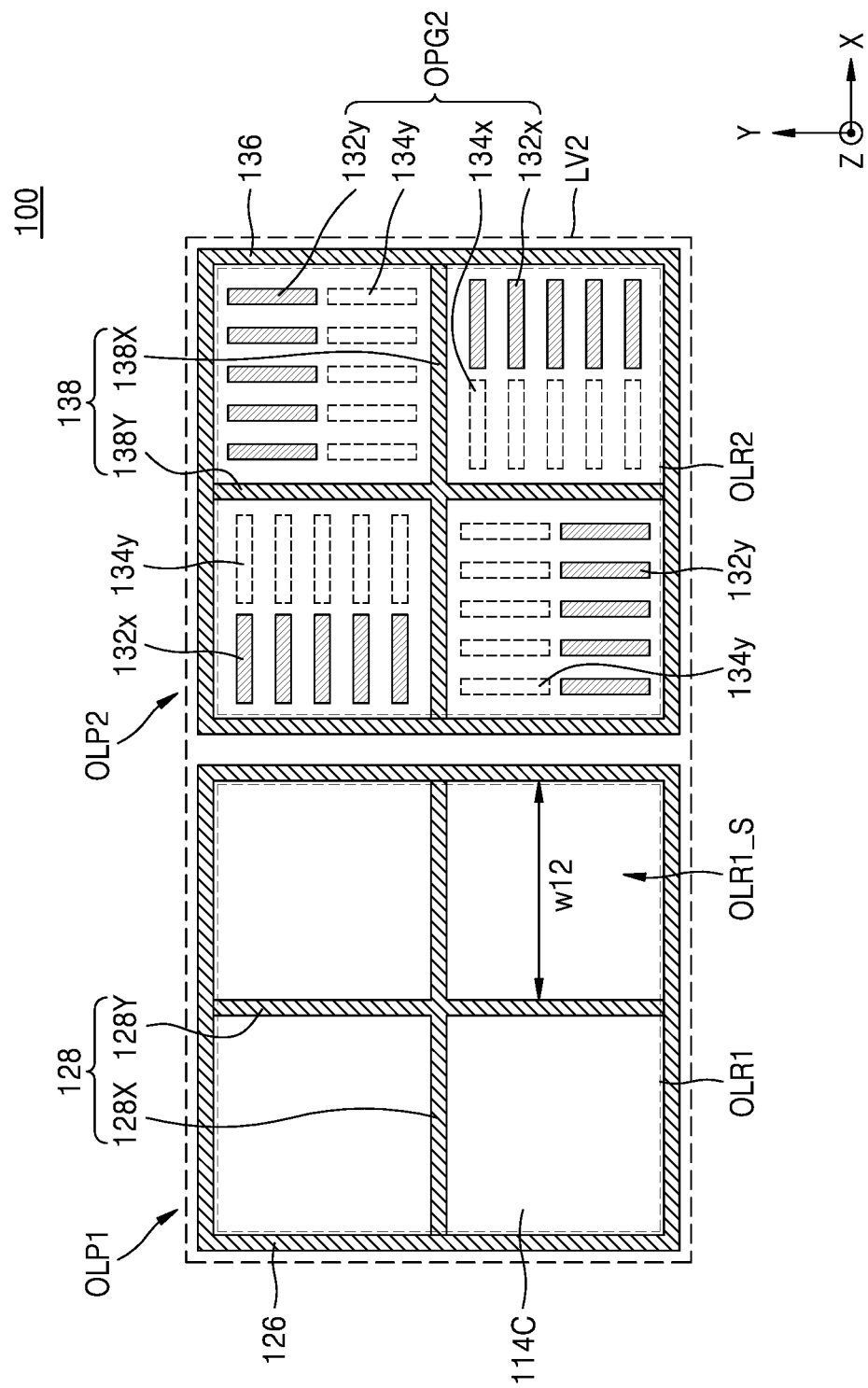
FIG. 7 is a horizontal cross-sectional view at a second vertical level of FIG. 5.

FIG. 3 is a cross-sectional view of a semiconductor device 100 according to example embodiments. FIG. 4 is a layout illustrating the overlay pattern region OLR of the semiconductor device 100 according to example embodiments. FIG. 5 is a cross-sectional view taken along a line B1-B1' of FIG. 4. FIG. 6 is a horizontal cross-sectional view at a first vertical level LV1 of FIG. 5, and FIG. 7 is a horizontal cross-sectional view at a second vertical level LV2 of FIG. 5.

The semiconductor devices 100 of FIGS. 3 to 7 may be structures produced after the semiconductor wafer 10W of FIGS. 1 and 2 is sawed and singulated into the semiconductor devices 100, respectively. Therefore, the semiconductor device 100 according to some embodiments may include the entire overlay pattern region OLR arranged on the scribe lanes SL around the cell region CHR. In the semiconductor device 100 according to other embodiments, a portion of the overlay pattern region OLR, which is arranged on the scribe lane SL around the cell region CHR, is sawed and removed, and only some portions of the overlay pattern region OLR may remain.

Referring to FIGS. 3 to 7, the semiconductor device 100 may include peripheral circuit transistors TR formed on a substrate 110, a lower structure LS, and a memory cell array MCA. The semiconductor device 100 may have a Cell Over Periphery (COP) structure in which the memory cell array MCA is arranged above the peripheral circuit transistors TR in the circuit region ICR (see FIG. 2).

The substrate 110 may be a portion of the semiconductor wafer 10W described with reference to FIG. 1. A device isolation layer 110I defining active regions AC may be formed on the substrate 110, and the peripheral circuit transistors TR may be formed on the active regions AC of the substrate 110. An impurity region (not illustrated) doped with impurities may be further formed on a portion of the active region AC.

The peripheral circuit transistor TR may form a driving circuit for driving the memory cell array MCA. For example, the driving circuits may be peripheral circuits capable of processing data input to the memory cell array MCA or output therefrom. For example, the peripheral circuit may be a page buffer, a latch circuit, a cache circuit, a column decoder, a sense amplifier, a data in/out circuit, a row decoder, or the like.

On the substrate 110, the lower structure LS may be arranged to cover the peripheral circuit transistor TR. The lower structure LS may include a lower insulating layer 112 and first to fourth insulating layers 114A to 114D sequentially stacked on the substrate 110. A first wire layer ML1 and a second wire layer ML2 may be arranged at a higher vertical level than the peripheral circuit transistor TR. On the substrate 110, lower contacts LSC penetrating the lower insulating layer 112 may connect the peripheral circuit transistor TR to the first wire layer ML1. First wire contacts MLC1 penetrating the second insulating layer 114B may connect the first wire layer ML1 to the second wire layer ML2, and second wire contacts MLC2 penetrating the fourth insulating layer 114D may connect the memory cell array MCA to the second wire layer ML2.

The memory cell array MCA may include a volatile memory such as Dynamic Random Access Memory (DRAM), Synchronous DRAM (SDRAM), Double Data Rate SDRAM (DDR SDRAM), Low Power Double Data Rate SDRAM (LPDDR SDRAM), Graphics Double Data Rate SDRAM (GDDR SDRAM), DDR2 SDRAM, DDR3

SDRAM, DDR4 SDRAM, or Thyristor RAM (TRAM), or a non-volatile memory such as Phase change Random Access Memory (PRAM), Magnetic Random Access Memory (MRAM), Resistive Random Access Memory (RRAM), or a NAND memory device of a vertical channel type.

In some embodiments, when the memory cell array MCA includes PRAM, a first memory unit ME1 may be arranged between a first word line WL1 and a bit line BL, and a second memory unit ME2 may be arranged between the bit line BL and a second word line WL2, as illustrated in FIG. 3. The first and second memory units ME1 and ME2 may each include a switching device SW and a variable resistance memory layer RE.

In example embodiments, the switching device SW may include an Ovonic threshold switching device, a diode, a tunnel junction, a PNP diode, a BJT, Mixed Ionic-Electronic Conduction (MIEC), or the like. The variable resistance memory layer RE may include a phase change material of which resistance changes according to a change in a crystalline state. For example, the variable resistance memory layer RE may include a chalcogenide material including at least two of germanium (Ge), selenium (Se), tellurium (Te), antimony (Sb), sulfur (S), indium (In), arsenic (As), gallium (Ga), silicon (Si), tin (Sn), bismuth (Bi), aluminum (Al), and yttrium (Y). In other embodiments, the variable resistance memory layer RE may include transition element oxide, for example, oxide including metal selected from among the group consisting of tantalum (Ta), zirconium (Zr), titanium (Ti), hafnium (Hf), manganese (Mn), Y, nickel (Ni), cobalt (Co), zinc (Zn), niobium (Nb), copper (Cu), iron (Fe), and chromium (Cr). In other embodiments, the variable resistance memory layer RE may have a Magnetic Tunnel Junction (MTJ) structure including two magnetic electrodes and a dielectric arranged between two magnetic electrodes.

FIG. 3 illustrates an example in which the first and second memory units ME1 and ME2 are arranged at different vertical levels in the memory cell array MCA. However, word lines, bit lines, and memory units may be additionally arranged at higher levels than the first and second memory units ME1 and ME2.

In other embodiments, when the memory cell array MCA includes a NAND memory device of a vertical channel type, gate electrodes (not illustrated) stacked in a vertical direction and channel structures (not illustrated) penetrating the gate electrodes and extending in the vertical direction may be arranged on the lower structure LS.

The overlay pattern region OLR may be arranged on some portions of the scribe lanes SL surrounding the cell region CHR. In the overlay pattern region OLR, a first overlay pattern structure OLP1 and a second overlay pattern structure OLP2 may be adjacent to each other. The first overlay pattern structure OLP1 and the second overlay pattern structure OLP2 may be buried in the lower structure LS, or for example, may be surrounded by the first to fourth insulating layers 114A to 114D of the lower structure LS. In example embodiments, each of the first and second overlay pattern structures OLP1 and OLP2 may be used as an overlay pattern during the photolithography process of forming the first and second wire layers ML1 and ML2 in the circuit region ICR.

The first overlay pattern structure OLP1 may include a first outer fence 126 defining a first overlay pattern region OLR1, a first overlay pattern group OPG1 in the first overlay pattern region OLR1, and a first inner fence 128 in the first overlay pattern region OLR1. In some embodiments, the first overlay pattern group OPG1 may be spaced apart from the first outer fence 126 and the first inner fence 128.

As illustrated in FIG. 4, the first overlay pattern group OPG1 may include first lower sub-patterns 122$x$ and first upper sub-patterns 124$x$ that extend in a first direction X, and second lower sub-patterns 122$y$ and second upper sub-patterns 124$y$ that extend in a second direction Y. The first lower sub-patterns 122$x$ may extend in the first direction X and may be apart from each other in the second direction Y. Each second lower sub-pattern 122$y$ may have a shape in which the first lower sub-pattern 122$x$ rotates 90 degrees.

The first lower sub-patterns 122$x$ and the first upper sub-patterns 124$x$ may be arranged at different vertical levels. Also, the second lower sub-patterns 122$y$ and the second upper sub-patterns 124$y$ may be arranged at different vertical levels. For example, the first lower sub-patterns 122$x$ and the second lower sub-patterns 122$y$ may be arranged at the same vertical level as the first wire layer ML1, and the first upper sub-patterns 124$x$ and the second upper sub-patterns 124$y$ may be arranged at the same vertical level as the first wire contact MLC1. The first lower sub-patterns 122$x$ and the second lower sub-patterns 122$y$ may be surrounded by the first insulating layer 114A, and the first upper sub-patterns 124$x$ and the second upper sub-patterns 124$y$ may be surrounded by the second insulating layer 114B.

The first overlay pattern group OPG1 (that is, the first lower sub-patterns 122$x$, the second lower sub-patterns 122$y$, the first upper sub-patterns 124$x$, and the second upper sub-patterns 124$y$) may each include tungsten (W), tungsten nitride (WN), gold (Au), silver (Ag), Cu, Al, titanium aluminum nitride (TiAlN), iridium (Ir), platinum (Pt), palladium (Pd), ruthenium (Ru), Zr, rhodium (Rh), Ni, Co, Cr, Sn, Zn, indium tin oxide (ITO), an alloy thereof, or a combination thereof. In some embodiments, the first overlay pattern group OPG1 may include a metal layer and a conductive barrier layer covering at least a portion of the metal layer. The conductive barrier layer may include, for example, Ti, titanium nitride (TiN), Ta, tantalum nitride (TaN), or a combination thereof.

For example, the first and second lower sub-patterns 122$x$ and 122$y$ and the first wire layer ML1 may be formed using a first mask (not illustrated) formed during a first photolithography process, and the first and second upper sub-patterns 124$x$ and 124$y$ and the first wire contact MLC1 may be formed using a second mask (not illustrated) formed during a second photolithography process.

In the plan view, the first outer fence 126 may surround the first overlay pattern region OLR1 and may have a square or rectangular shape. The first outer fence 126 may penetrate the first to fourth insulting layers 114A to 114D and extend in a vertical direction Z.

The first inner fence 128 may be in the first overlay pattern region OLR1 defined by the first outer fence 126. In the plan view, the first inner fence 128 may have a two-line shape in which two lines pass through a central portion of the first overlay pattern region OLR1 and cross each other. For example, the first inner fence 128 may include a first line segment 128X extending in the first direction X and a second line segment 128Y extending in the second direction Y, and the first line segment 128X and the second line segment 128Y may cross each other at the central portion of the first overlay pattern region OLR1. In the plan view, for example, the first inner fence 128 may have a cross shape and may divide (e.g., quadrisect) the first overlay pattern region OLR1 into four sub-regions OLR1_S (FIG. 7).

As illustrated in FIG. 5, each of the first outer fence 126 and the first inner fence 128 may include first to fourth fence segments SE1 to SE4 stacked in a direction perpendicular to an upper surface of the substrate 110. For example, the first to fourth fence segments SE1 to SE4 may be arranged at different levels and may overlap each other in the vertical direction Z.

For example, the first fence segment SE1 may have an upper surface arranged at the same level as the first and second lower sub-patterns 122x and 122y, and a side wall of the first fence segment SE1 may be surrounded by the first insulating layer 114A. The second fence segment SE2 may be arranged on the first fence segment SE1 and may have an upper surface arranged at the same level as the first and second upper sub-patterns 124x and 124y, and a side wall of the second fence segment SE2 may be surrounded by the second insulating layer 114B. The third and fourth fence segments SE3 and SE4 may be arranged at a higher vertical level than the first overlay pattern group OPG1, and side walls of the third and fourth fence segments SE3 and SE4 may be surrounded by the third and fourth insulating layers 114C and 114D, respectively.

In example embodiments, a height of the first fence segment SE1 in the vertical direction Z may be substantially the same as a height of the first lower sub-pattern 122x, and heights of each of the first outer fence 126 and the first inner fence 128 in the vertical direction Z may be greater than the height of the first lower sub-pattern 122x. For example, the heights of each of the first outer fence 126 and the first inner fence 128 in the vertical direction Z may about 2 to 10 times the height of the first lower sub-pattern 122x, but the heights of the first outer fence 126 and the first inner fence 128 are not limited thereto.

The second overlay pattern structure OLP2 may include a second outer fence 136 defining a second overlay pattern region OLR2, a second overlay pattern group OPG2 in the second overlay pattern region OLR2, and a second inner fence 138 in the second overlay pattern region OLR2.

As illustrated in FIG. 4, the second overlay pattern group OPG2 may include third lower sub-patterns 132x and third upper sub-patterns 134x extending in the first direction X, and fourth lower sub-patterns 132y and fourth upper sub-patterns 134y extending in the second direction Y.

The third lower sub-patterns 132x and the fourth lower sub-patterns 132y may be at the same vertical level as the second wire layer ML2, and the third upper sub-patterns 134x and the fourth upper sub-patterns 134y may be at the same vertical level as the second wire contact MLC2.

The third lower sub-patterns 132x and the fourth lower sub-patterns 132y may be surrounded by the third insulating layer 114C, and the third upper sub-patterns 134x and the fourth upper sub-patterns 134y may be surrounded by the fourth insulating layer 114D.

The second overlay pattern group OPG2 (that is, the third lower sub-patterns 132x, the fourth lower sub-patterns 132y, the third upper sub-patterns 134x and the fourth upper sub-patterns 134y) may each include W, WN, Au, Ag, Cu, Al, TiAlN, Ir, Pt, Pd, Ru, Zr, Rh, Ni, Co, Cr, Sn, Zn, ITO, an alloy thereof, or a combination thereof. In some embodiments, the second overlay pattern group OPG2 may include a metal layer and a conductive barrier layer covering at least a portion of the metal layer. The barrier layer may include, for example, Ti, TiN, Ta, TaN, or a combination thereof.

In the plan view, the second outer fence 136 may surround the second overlay pattern region OLR2. As illustrated in FIG. 4, the second outer fence 136 may be apart from the first outer fence 126 at a certain interval. The second outer fence 136 may penetrate the first to fourth insulating layers 114A to 114D and extend in the vertical direction Z.

The second inner fence 138 may be arranged in the second overlay pattern region OLR2 defined by the second outer fence 136. The second inner fence 138 may include a first line segment 138X extending in the first direction X and a second line segment 138Y extending in the second direction Y, and the first line segment 138X and the second line segment 138Y may cross each other at a central portion of the second overlay pattern region OLR2. For example, in the plan view, the second inner fence 138 may have a cross shape and may divide the second overlay pattern region OLR2 into four sub-regions OLR2_S (FIG. 6).

Similar to the first outer fence 126 and the first inner fence 128, the second outer fence 136 and the second inner fence 138 may each include the first to fourth fence segments SE1 to SE4 stacked in the direction perpendicular to the upper surface of the substrate 110.

The first to fourth fence segments SE1 to SE4 may each include W, WN, Au, Ag, Cu, Al, TiAlN, Ir, Pt, Pd, Ru, Zr, Rh, Ni, Co, Cr, Sn, Zn, ITO, an alloy thereof, or a combination thereof. In some embodiments, the first to fourth fence segments SE1 to SE4 may each include a metal layer and a conductive barrier layer covering at least a portion of the metal layer. The conductive barrier layer may include, for example, Ti, TiN, Ta, TaN, or a combination thereof.

As illustrated in FIG. 6, the first overlay pattern group OPG1 and the first insulating layer 114A may be arranged in the first overlay pattern region OLR1 at the first vertical level LV1, and the first insulating layer 114A surrounded by the second outer fence 136 may be arranged in the second overlay pattern region OLR2. The second inner fence 138 may divide the second overlay pattern region OLR2, which is defined by the second outer fence 136, into four sub-regions OLR2_S, and the first insulating layer 114A may be arranged in each sub-region OLR2_S. A width w11 of the first insulating layer 114A arranged in each sub-region OLR2_S may be less than about 20 micrometers (μm). Although not illustrated, similarly to the first insulating layer 114A, the second insulating layer 114B may also be arranged in each sub-region OLR2_S.

As illustrated in FIG. 7, the second overlay pattern group OPG2 and the third insulating layer 114C may be arranged in the second overlay pattern region OLR2 at the second vertical level LV2, and the third insulating layer 114C, which is surrounded by the first outer fence 126, may be arranged in the first overlay pattern region OLR1. The first inner fence 128 may divide the first overlay pattern region OLR1, which is defined by the first outer fence 126, into four sub-regions OLR1_S, and the third insulating layer 114C may be arranged in each sub-region OLR1_S. A width s12 of the third insulating layer 114C arranged in each sub-region OLR1_S may be less than about 20 μm. Although not illustrated, similarly to the third insulating layer 114C, the fourth insulating layer 114D may be arranged in each sub-region OLR1_S.

The memory cell array MCA and the overlay pattern region OLR may be covered by an upper insulating layer 160. Cell contacts CLC may be surrounded by the upper insulating layer 160 and may connect the second word line WL2 to the second wire contact MLC2.

In example embodiments, the first overlay pattern group OPG1 and the second overlay pattern group OPG2 may be used to measure overlays by using an overlay measuring device during manufacturing processes of the semiconductor device 100. For example, a photoresist pattern may be formed on the first overlay pattern group OPG1 through the photolithography process, and before a subsequent process (e.g., an etching process) is performed using the photoresist pattern, the overlays may be measured using the photoresist pattern.

For example, the first overlay pattern group OPG1 and the second overlay pattern group OPG2 may be diffraction-based overlay patterns or scanning electron microscope (SEM) overlay patterns. In example embodiments, images of the first overlay pattern group OPG1 (that is, images of the first and second lower sub-patterns 122x and 122y and first and second upper sub-patterns 124x and 124y) may be extracted by scanning high-energy electron beams, for example, electron beams having energy of about 10 keV or greater. Accordingly, the images of the first overlay pattern group OPG1 may be utilized to measure overlay consistency between upper layers (e.g., the first wire contact MLC1 and the first and second upper sub-patterns 124x and 124y) and lower layers (e.g., the first wire layer ML1 and the first and second lower sub-patterns 124x and 124y).

Because the first outer fence 126 and the first inner fence 128 are arranged not to vertically overlap the first overlay pattern group OPG1 and the second outer fence 136 and the second inner fence 138 are arranged not to vertically overlap the second overlay pattern group OPG2, the first and second outer fences 126 and 136 and the first and second inner fences 128 and 138 may not affect the performance of the overlay consistency in a process of measuring the overlays.

In general, an overlay pattern formed on the scribe lane SL may have a relatively great size, and a relatively great upper-level difference may occur between a first region where the overlay pattern is formed and a second region around the overlay pattern (e.g., a region typically including an oxide layer). Also, in the case of a COP structure in which a memory cell array is arranged on a peripheral circuit region, the upper-level difference in the overlay pattern region may increase according to an increase in the number of wire layers under the memory cell array, and in this case, process defects such as focusing failure may be caused in a manufacturing process of the memory cell array.

However, according to example embodiments, the first and second outer fences 126 and 136 and the first and second inner fences 128 and 138 may penetrate the first to fourth insulating layers 114A to 114D and may extend in the vertical direction Z. The first to fourth insulating layers 114A to 114D may be formed in relatively small widths even in a region where an overlay pattern is not formed, and the first and second outer fences 126 and 136 and the first and second inner fences 128 and 138 may function as dummy patterns for preventing/impeding the occurrence of dishing in a CMP process. Accordingly, an upper-level difference between the overlay pattern region and a neighboring region may decrease, and defects such as focusing failure may be prevented/impeded or decrease in a subsequent process of forming the memory cell array on the first overlay pattern.

Figure 8:
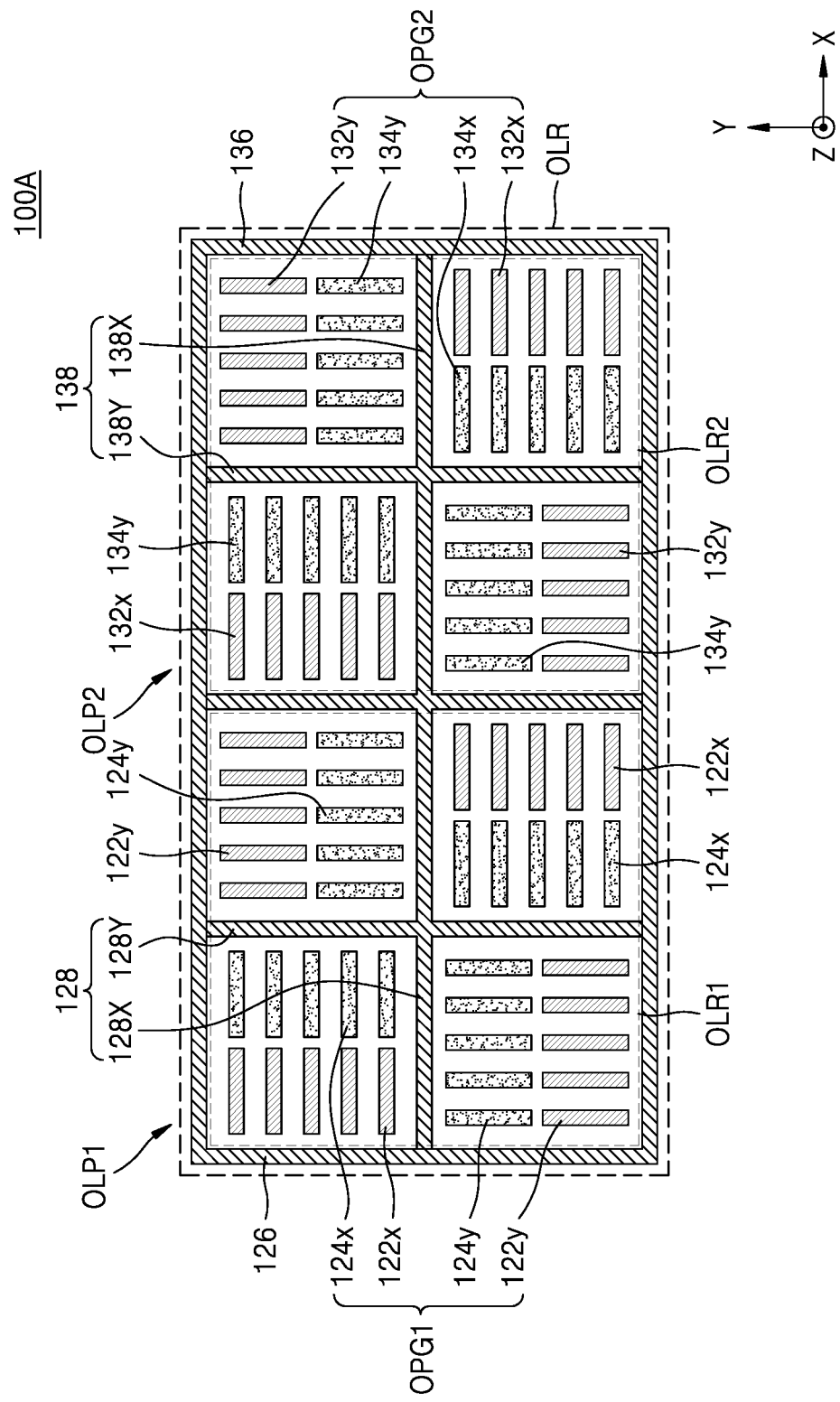
FIG. 8 is a layout illustrating a semiconductor device according to example embodiments.

FIG. 8 is a layout illustrating a semiconductor device 100A according to example embodiments.

Referring to FIG. 8, the first overlay pattern structure OLP1 and the second overlay pattern structure OLP2 may be arranged side by side without any gap therebetween, and a portion of the first outer fence 126 may be connected to the second outer fence 136 at a boundary between the first overlay pattern structure OLP1 and the second overlay pattern structure OLP2.

Figure 9:
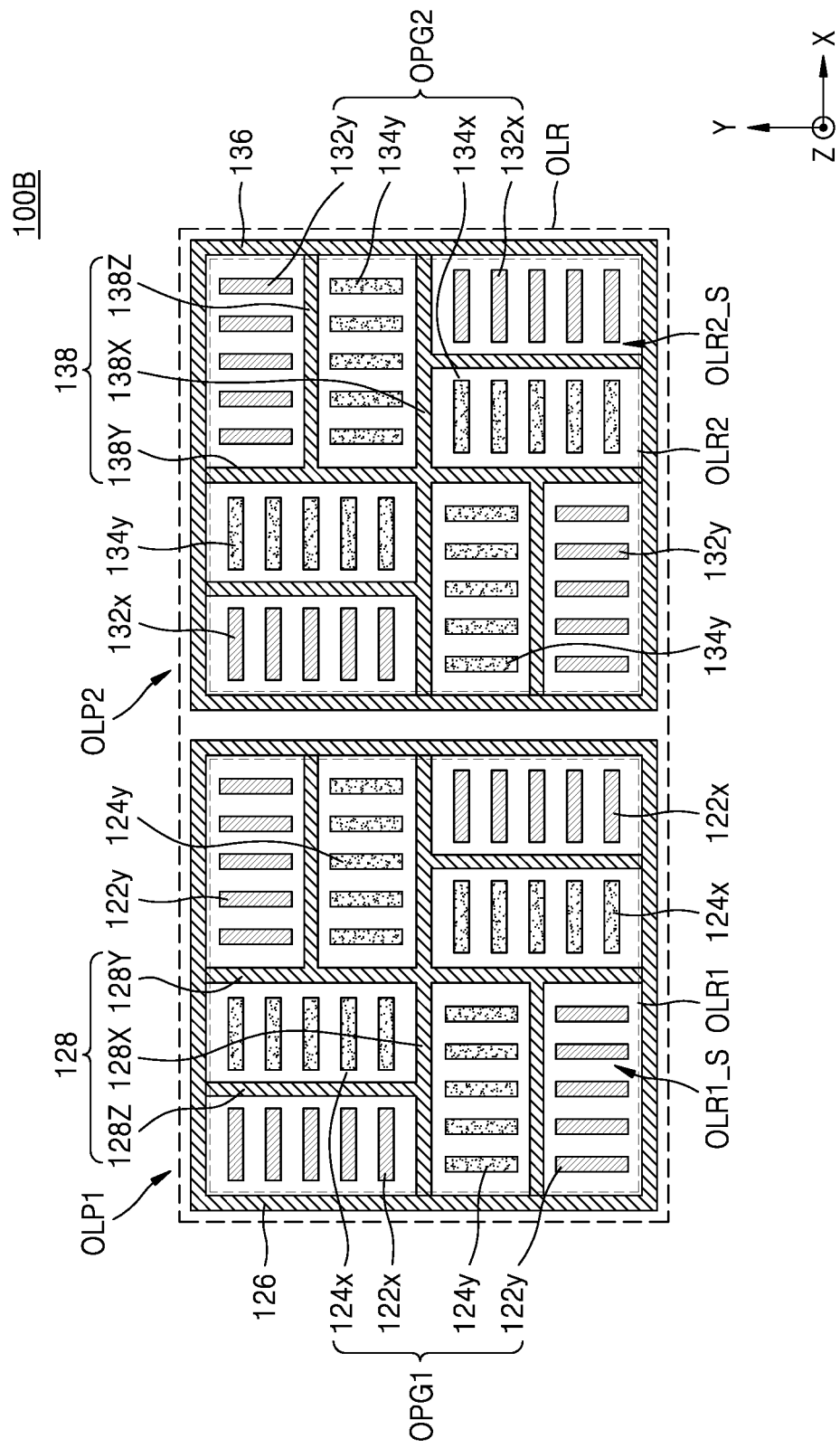
FIG. 9 is a layout illustrating a semiconductor device according to example embodiments.

FIG. 9 is a layout illustrating a semiconductor device 100B according to example embodiments.

Referring to FIG. 9, the first inner fence 128 may divide the first overlay pattern region OLR1 into eight sub-regions OLR1_S. For example, the first inner fence 128 may include the first line segment 128X, which passes through the central portion of the first overlay pattern region OLR1 and extends in the first direction X, and the second line segment 128Y, which passes through the central portion of the first overlay pattern region OLR1 and extends in the second direction Y, and may further include a third line segment 128Z which bisects four sub-regions defined by the first line segment 128X, the second line segment 128Y, and the first outer fence 126.

Similarly, the second inner fence 138 may divide the second overlay pattern region OLR2 into eight sub-regions OLR2_S. For example, the second inner fence 138 may include the first line segment 138X, which passes through the second overlay pattern region OLR2 and extends in the first direction X, and the second line segment 138Y, which passes through the second overlay pattern region OLR2 and extends in the second direction Y, and may further include a third line segment 138Z which bisects four sub-regions defined by the first line segment 138X, the second line segment 138Y, and the second outer fence 136.

Figure 10:
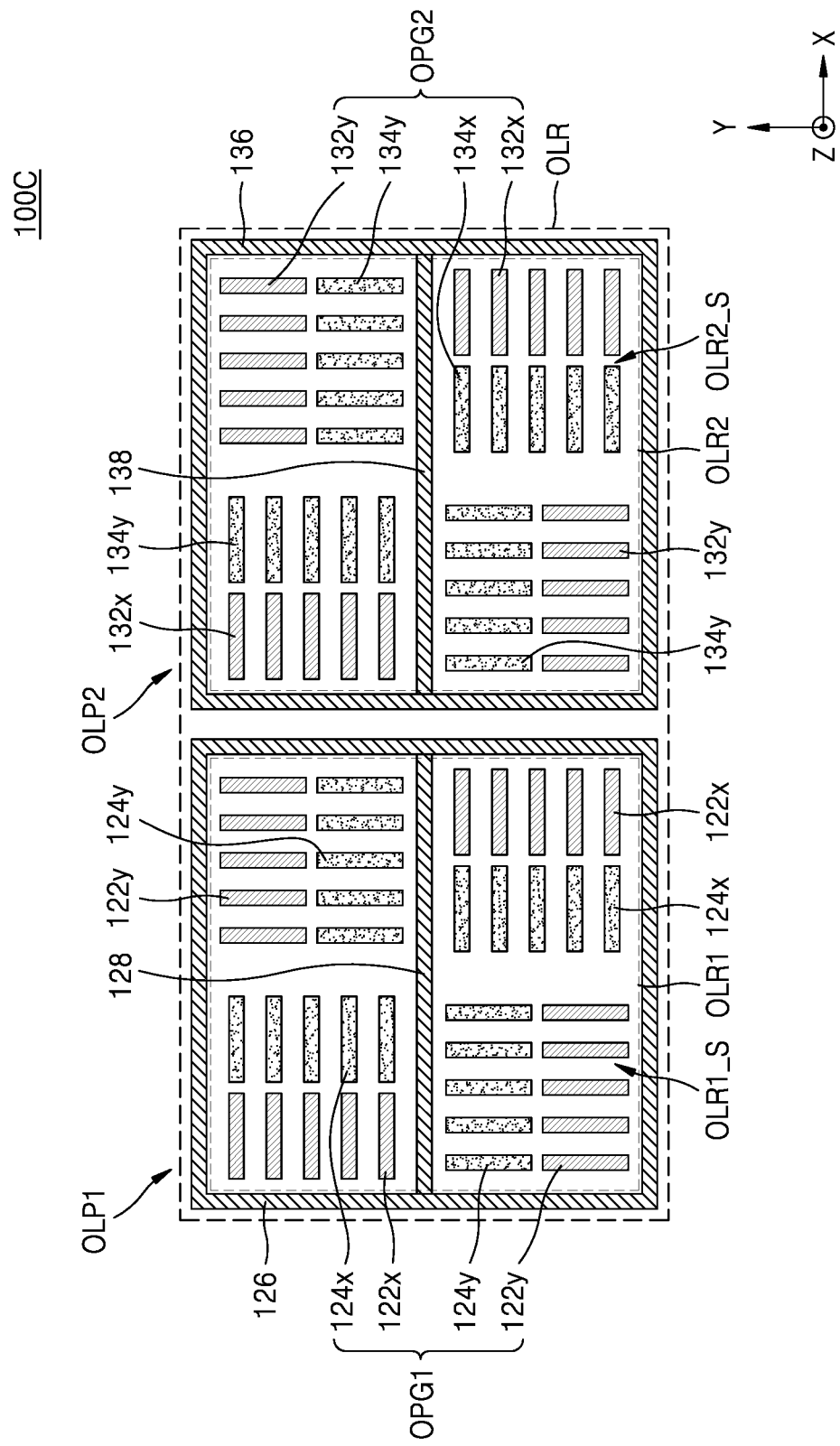
FIG. 10 is a layout illustrating a semiconductor device according to example embodiments.

FIG. 10 is a layout illustrating a semiconductor device 100C according to example embodiments.

Referring to FIG. 10, the first inner fence 128 may divide the first overlay pattern region OLR1 into two sub-regions OLR1_S. For example, the first inner fence 128 may pass through the central portion of the first overlay pattern region OLR1 and may extend in the first direction X. Alternatively, unlike the illustration, the first inner fence 128 may pass through the central portion of the first overlay pattern region OLR1 and may extend in the second direction Y.

The second inner fence 138 may divide the second overlay pattern region OLR2 into two sub-regions OLR2_S. For example, the second inner fence 138 may pass through the central portion of the second overlay pattern region OLR2 and may extend in the first direction X. Alternatively, unlike the illustration, the second inner fence 138 may pass through the central portion of the second overlay pattern region OLR2 and may extend in the second direction Y.

Figure 11:
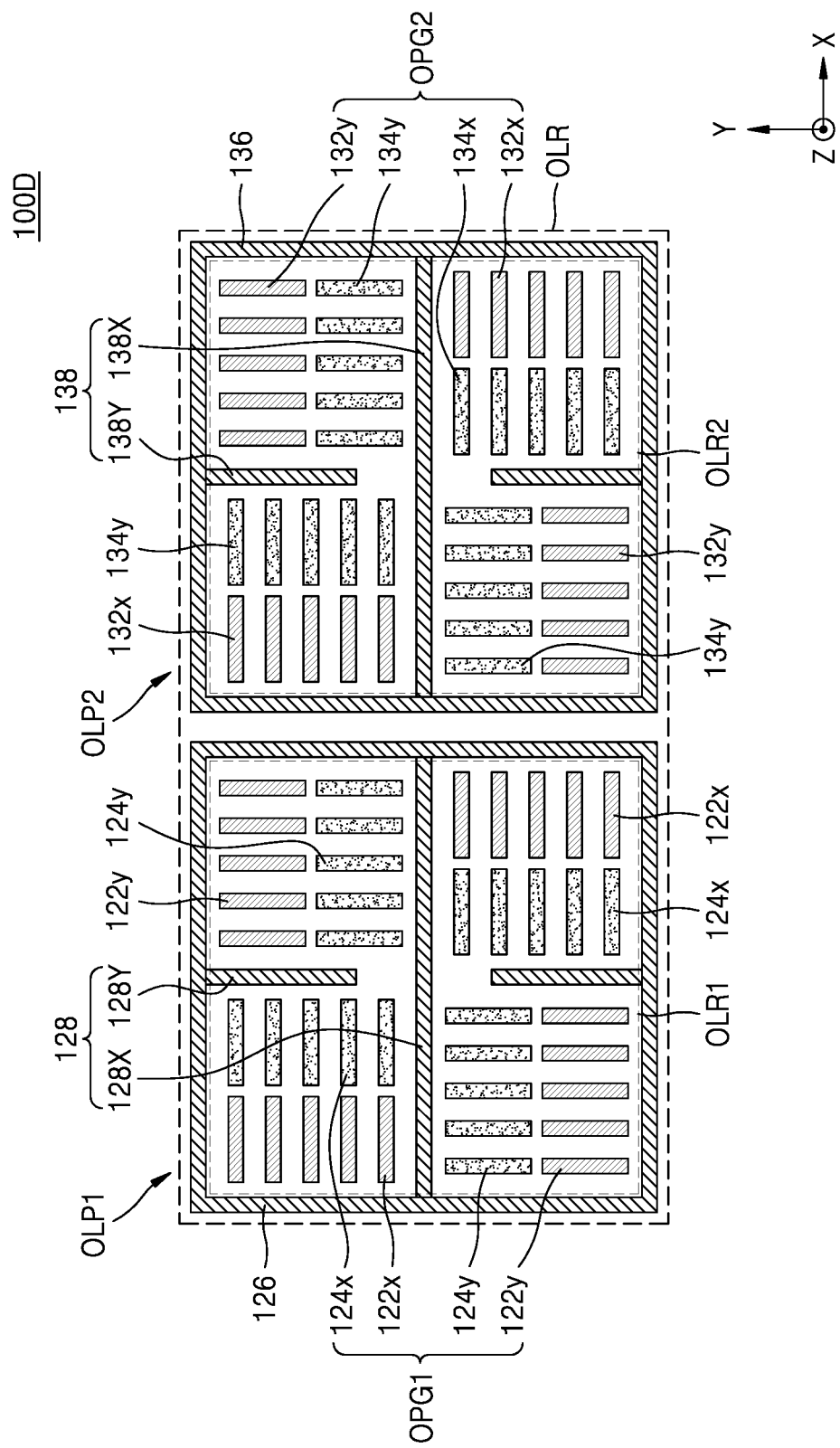
FIG. 11 is a layout illustrating a semiconductor device according to example embodiments.

FIG. 11 is a layout illustrating a semiconductor device 100D according to example embodiments.

Referring to FIG. 11, the second inner fence 128 may include the first line segment 128X and the second line segment 128Y, and at least one of the first line segment 128X and the second line segment 128Y may be discontinuously formed. For example, the first line segment 128X may extend in the first direction X across the entire width of the first overlay pattern region OLR1, whereas the second line segment 128Y may extend in the second direction Y having a width (or length) smaller than the entire width (or length) of the first overlay pattern region OLR1. As a result, the second line segment 128Y may be spaced apart from the first line segment 128X.

Similarly, the second inner fence 138 may include the first line segment 138X and the second line segment 138Y, and at least one of the first line segment 138X and the second line segment 138Y may be discontinuously formed.

Figure 12:
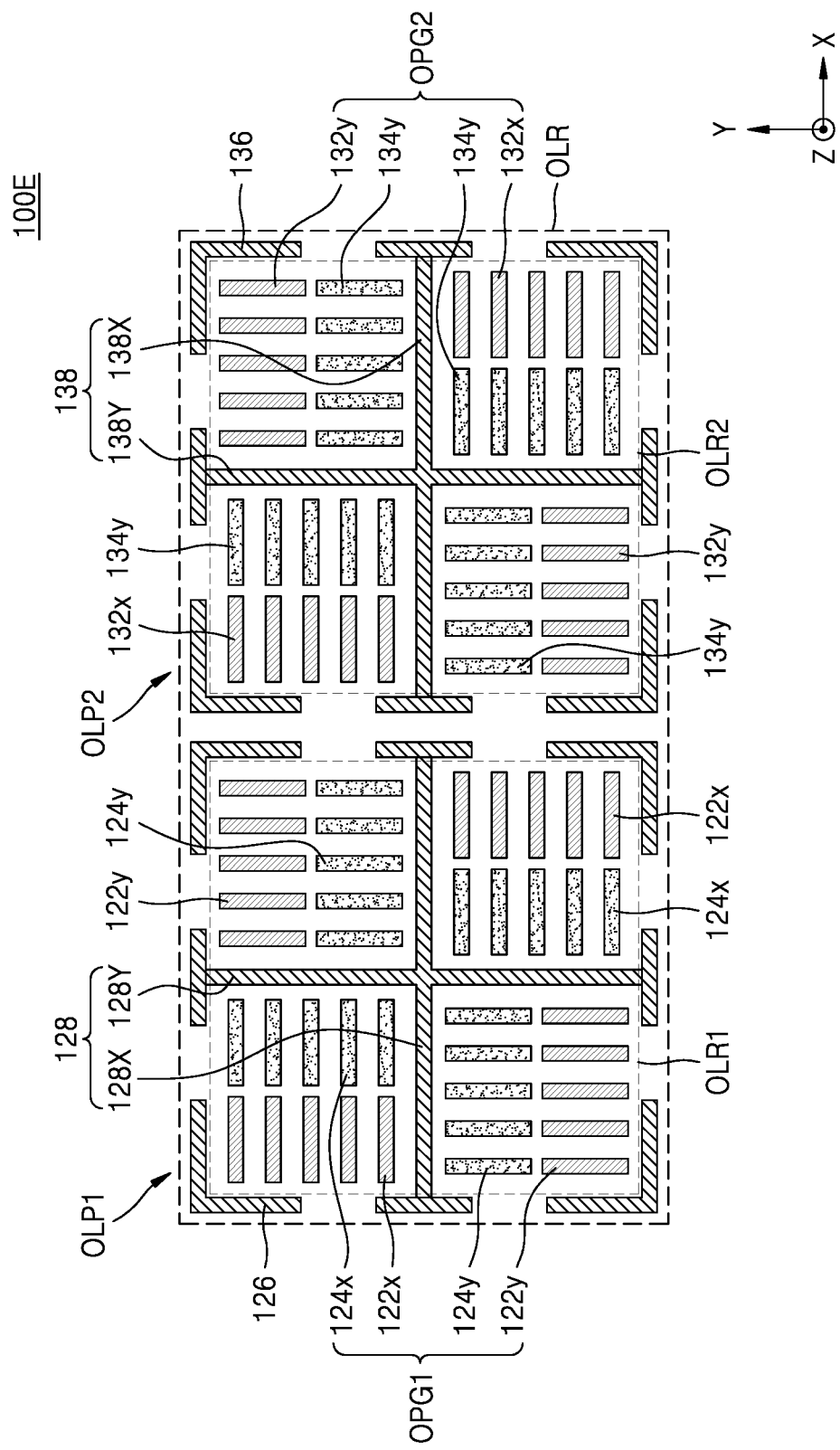
FIG. 12 is a layout of a semiconductor device according to example embodiments.

FIG. 12 is a layout illustrating a semiconductor device 100E according to example embodiments.

Referring to FIG. 12, the first outer pattern 126 may be discontinuously formed to discontinuously surround at least a portion of the first overlay pattern region OLR1 instead of entirely surrounding the first overlay pattern region OLR1. Similarly, the second outer fence 136 may be discontinuously formed to discontinuously surround at least a portion of the second overlay pattern region OLR2 instead of entirely surrounding the second overlay pattern region OLR2.

Figure 13:
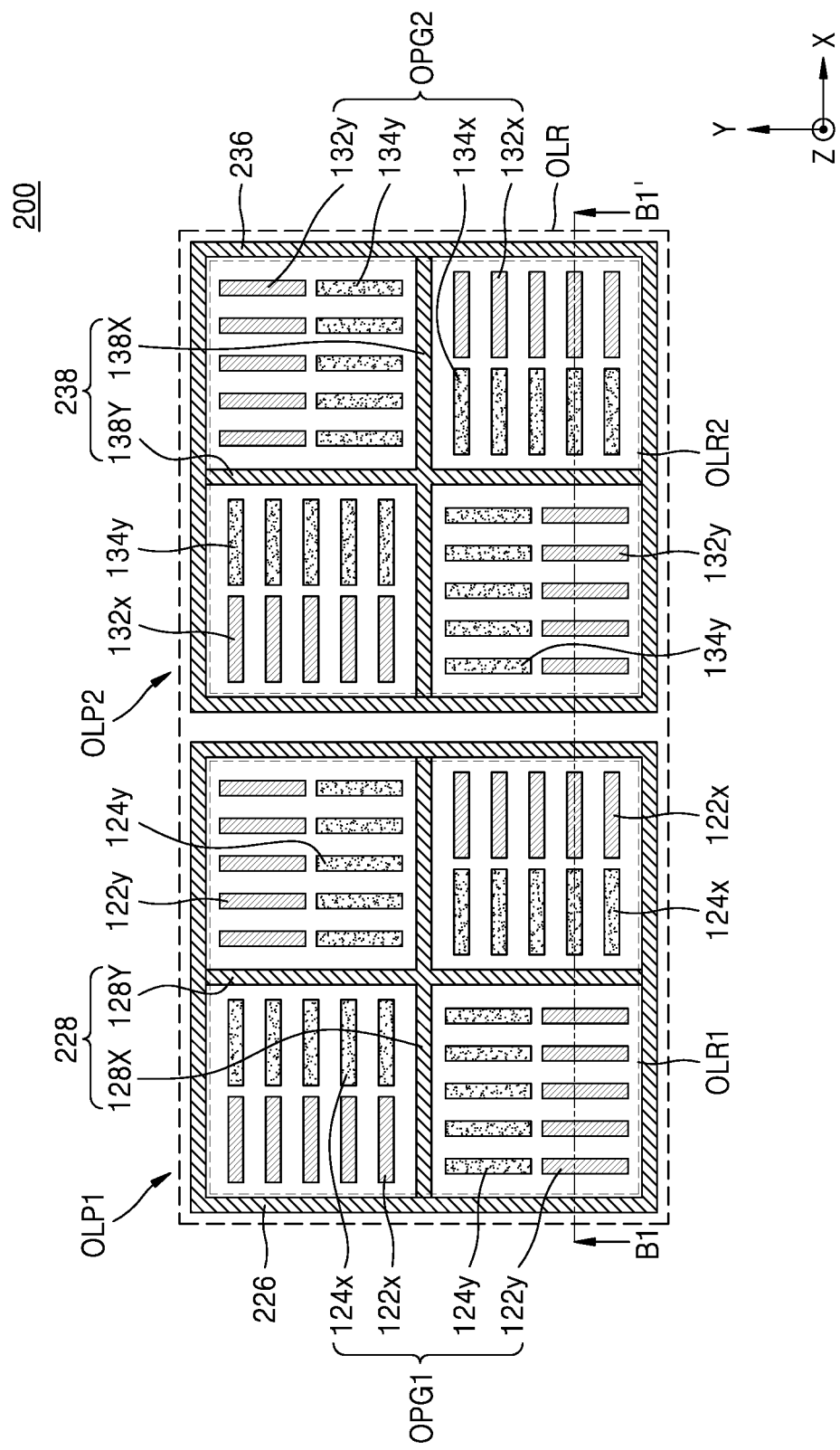
FIG. 13 is a layout illustrating an overlay pattern region of a semiconductor device, according to example embodiments.
Figure 14:
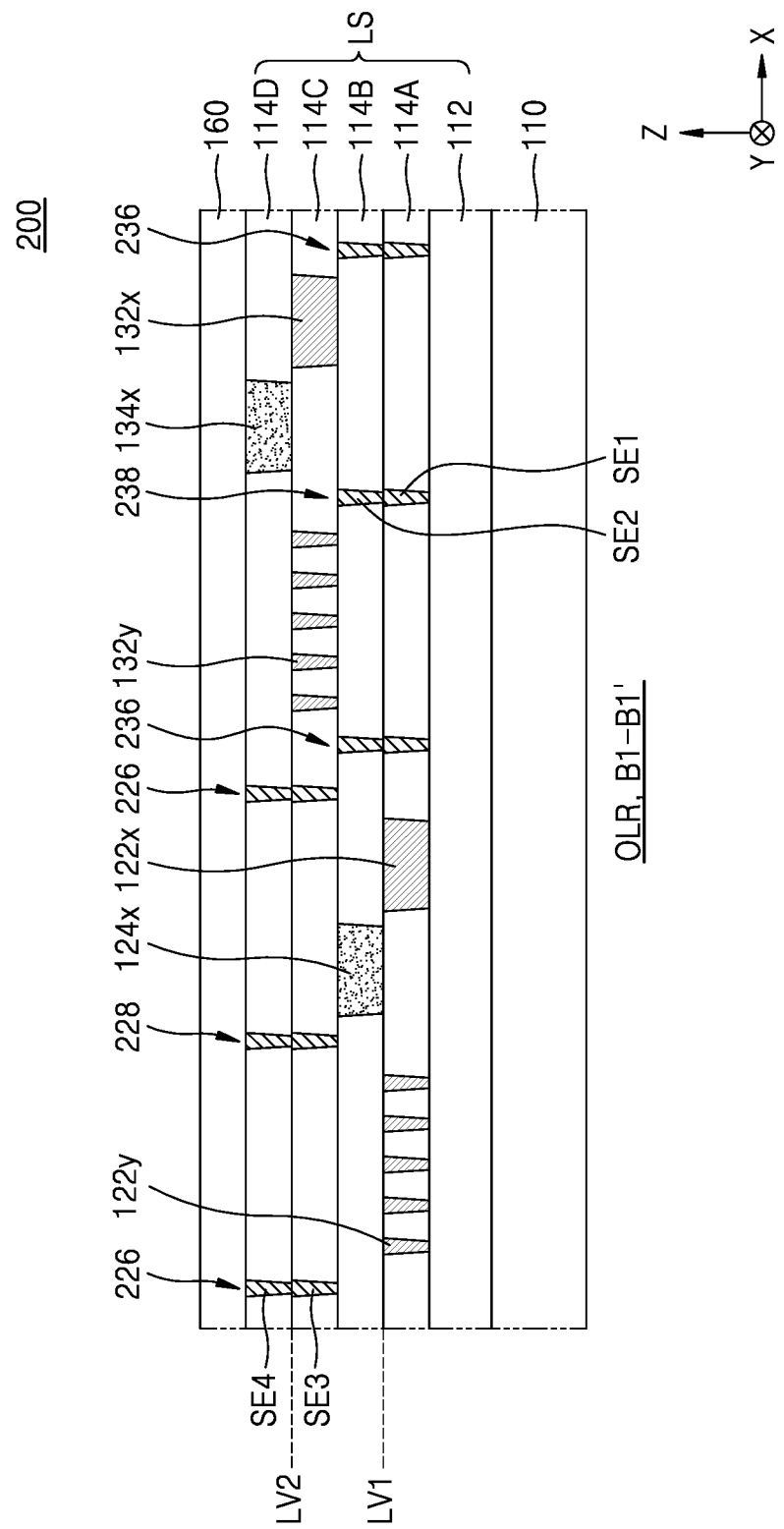
FIG. 14 is a cross-sectional view taken along a line B1-B1' of FIG. 13.
Figure 15:
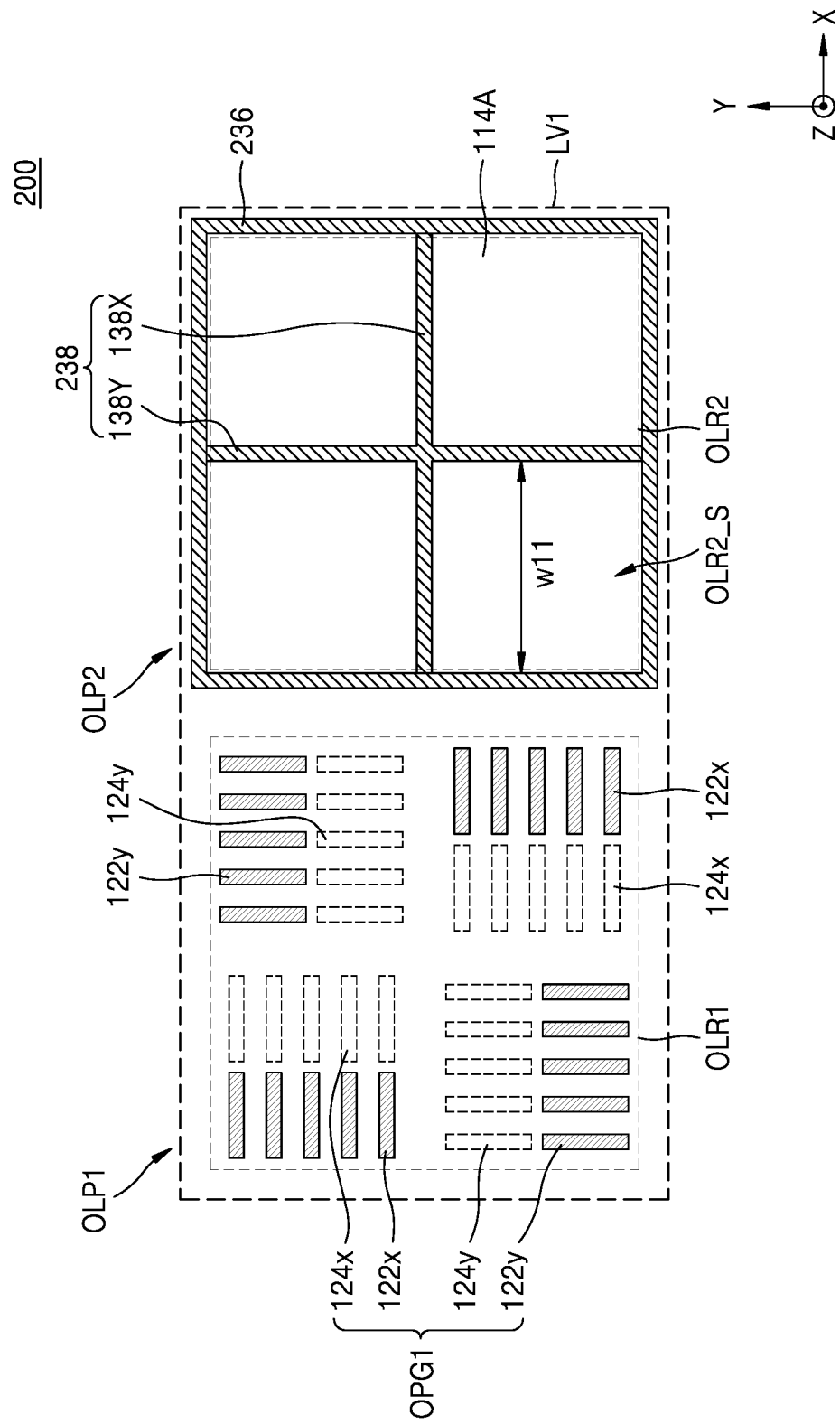
FIG. 15 is a horizontal cross-sectional view at a first vertical level of FIG. 14.
Figure 16:
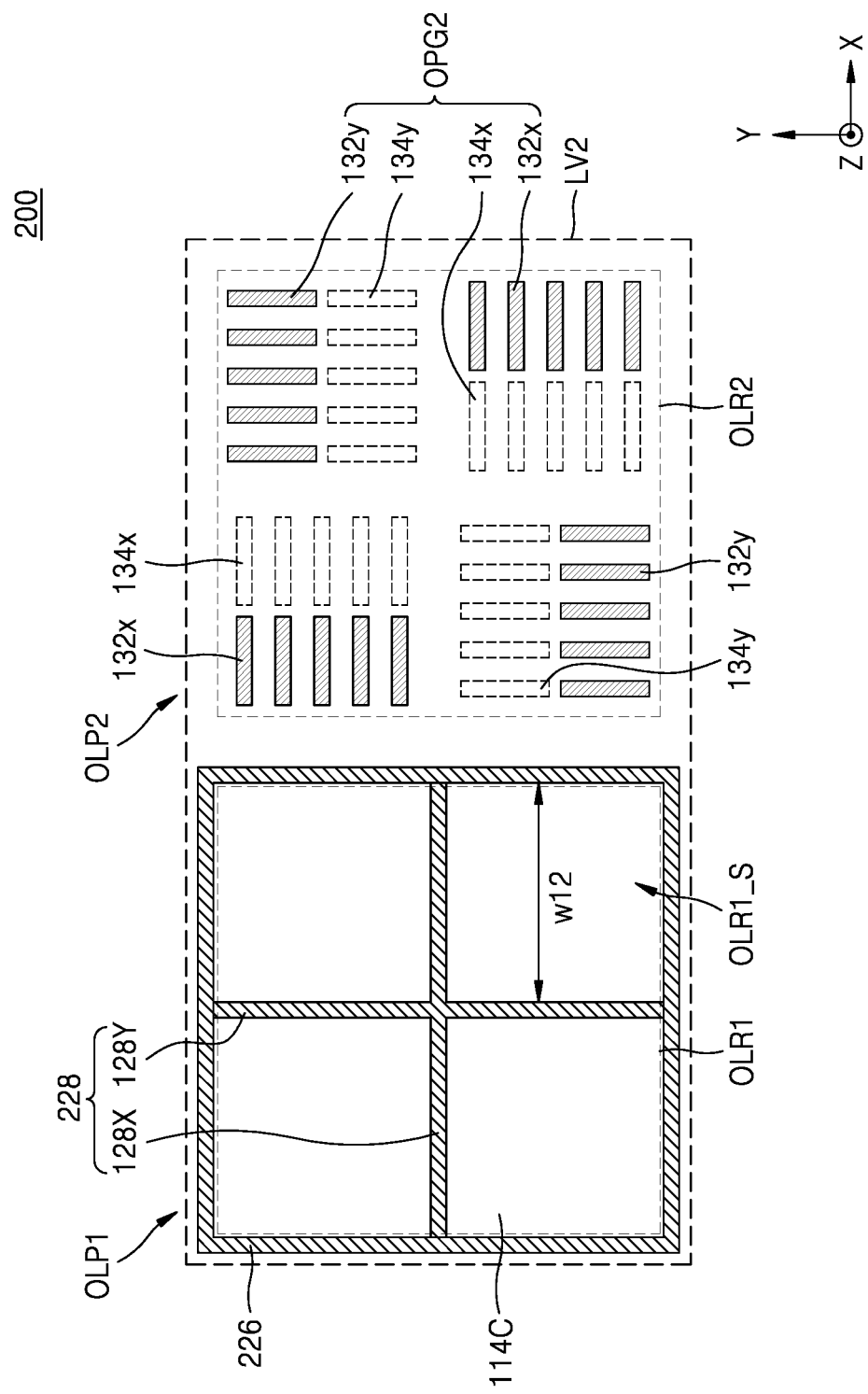
FIG. 16 is a horizontal cross-sectional view at a second vertical level of FIG. 14.
Figure 17:
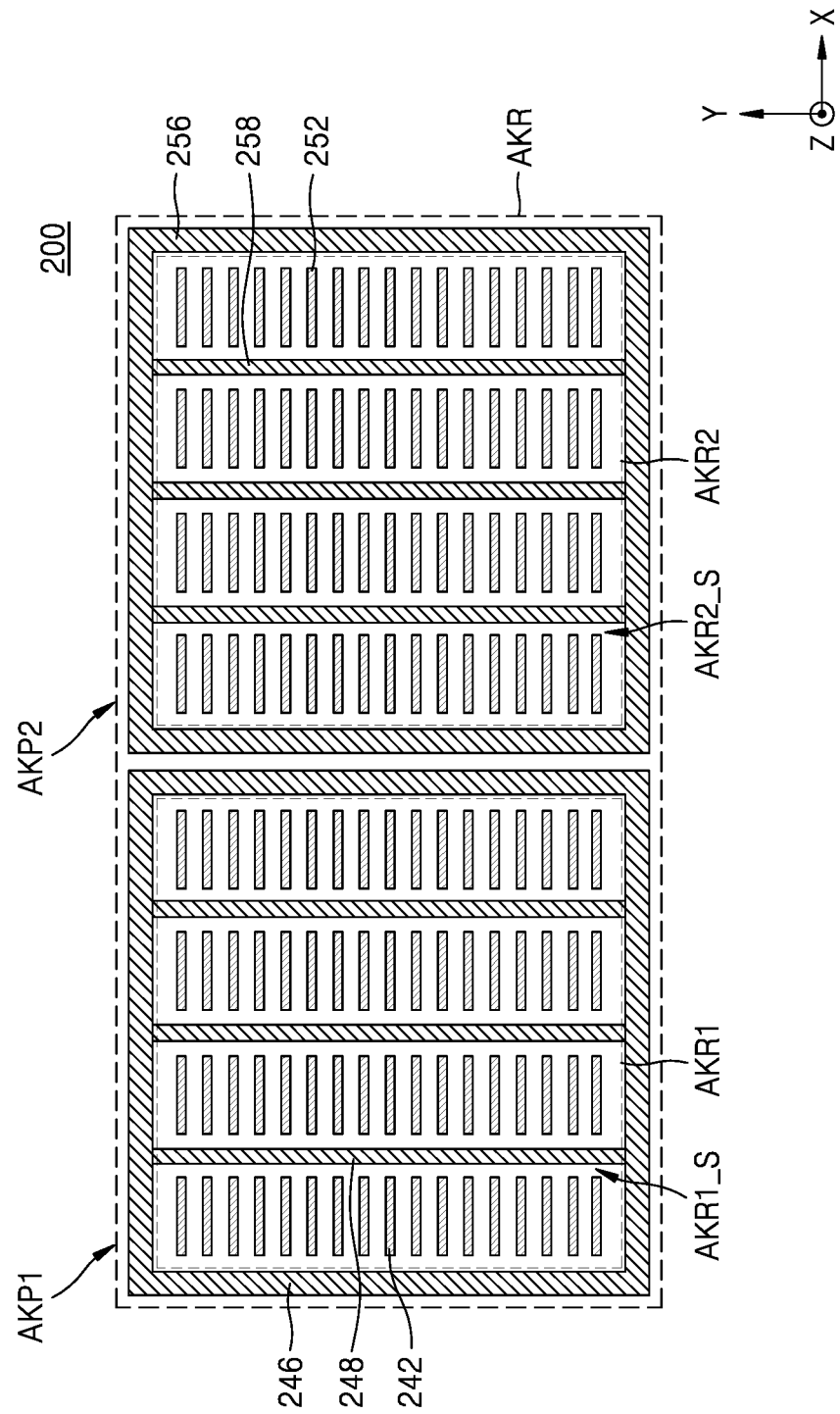
FIG. 17 is a layout illustrating an alignment key region of a semiconductor device, according to example embodiments.
Figure 18:
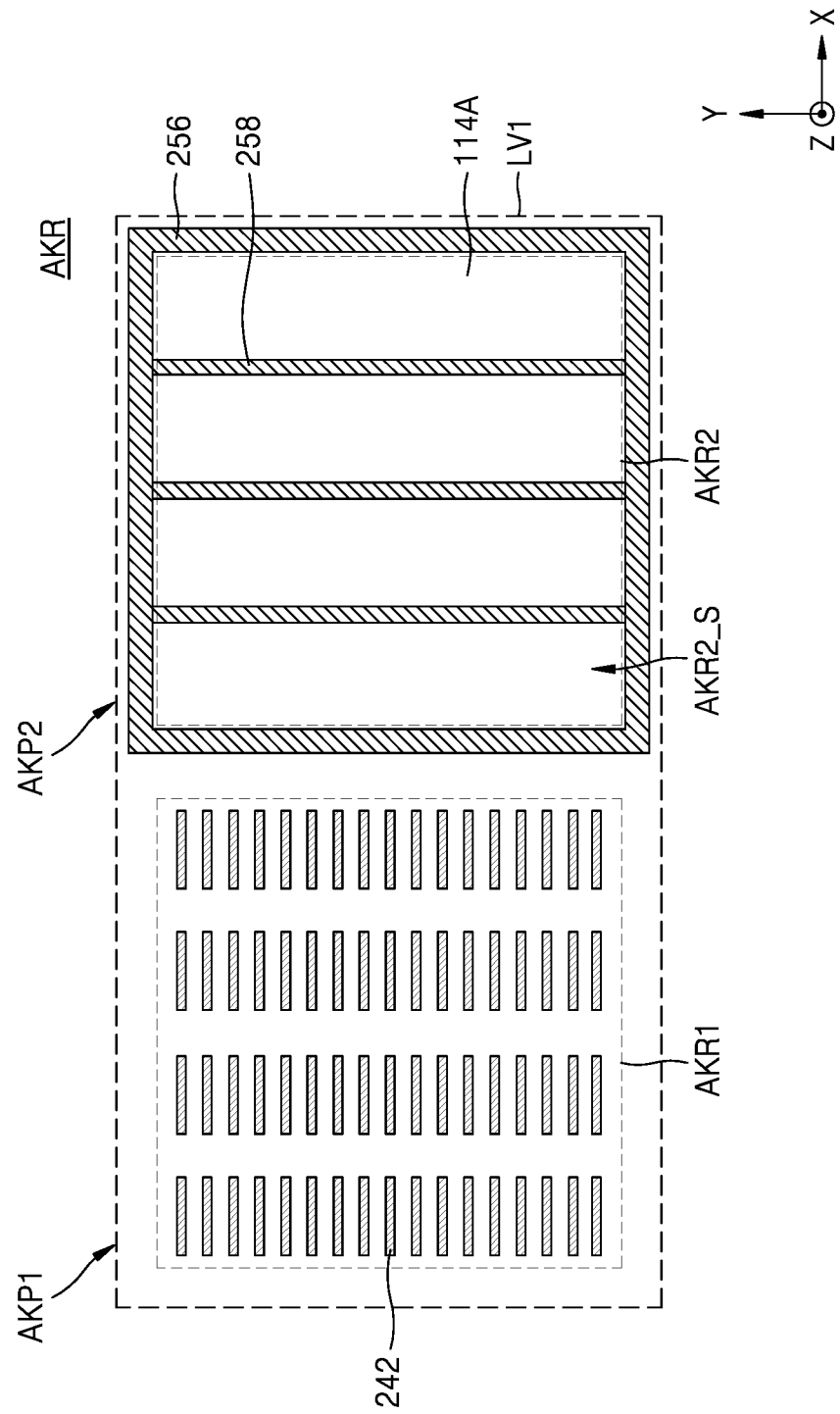
FIG. 18 is a horizontal cross-sectional view at a first vertical level of FIG. 17.
Figure 19:
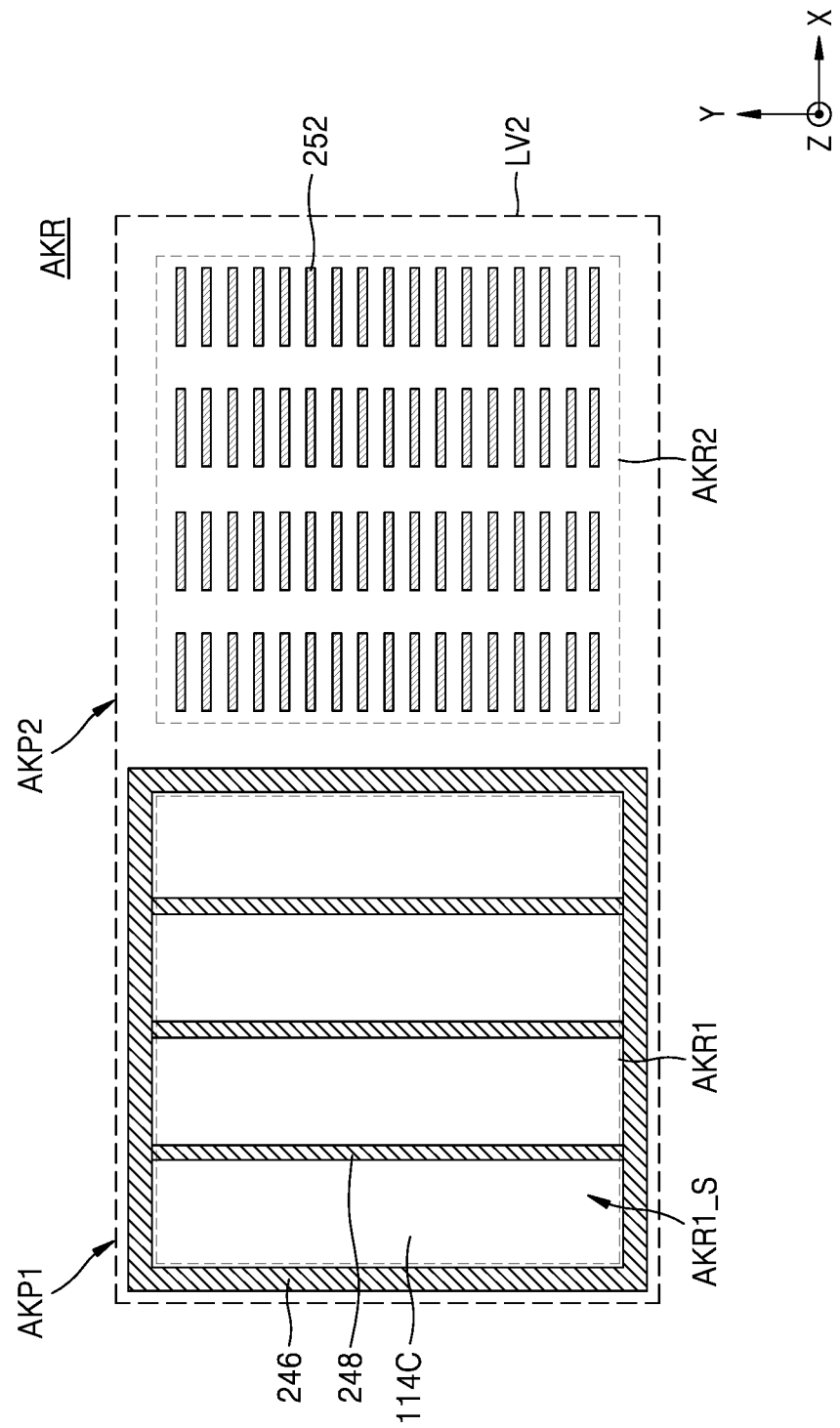
FIG. 19 is a horizontal cross-sectional view at a second vertical level of FIG. 17.

FIG. 13 is a layout of an overlay pattern region OLR of a semiconductor device 200, according to example embodiments. FIG. 14 is a cross-sectional view taken along a line B1-B1' of FIG. 13, FIG. 15 is a horizontal cross-sectional view at a first vertical level LV1 of FIG. 14, and FIG. 16 is a horizontal cross-sectional view at a second vertical level LV2 of FIG. 14. FIG. 17 is a layout illustrating an alignment key region AKR of the semiconductor device 200, according to example embodiments. FIG. 18 is a horizontal cross-sectional view at a first vertical level LV1 of FIG. 17, and FIG. 19 is a horizontal cross-sectional view at a second vertical level LV2 of FIG. 17.

Referring to FIGS. 13 to 19, the first overlay pattern structure OLP1 and the second overlay pattern structure OLP2 may be arranged in the overlay pattern region OLR of the semiconductor device 200, and the first alignment key structure AKP1 and the second alignment key structure AKP2 may be arranged in the alignment key region AKR of the semiconductor device 200.

In the overlay pattern region OLR, the first overlay pattern structure OLP1 may include the first overlay pattern group OPG1, a first outer fence 226, and a first inner fence 228, and the first outer fence 226 and the first inner fence 228 may be arranged at different vertical levels from the first overlay pattern group OPG1.

For example, the first lower sub-patterns 122x and the second lower sub-patterns 122y may be arranged at the same vertical level as the first wire layer ML1, and the first upper sub-patterns 124x and the second upper sub-patterns 124y may be arranged at the same vertical level as the first wire contact MLC1. The first lower sub-patterns 122x and the second lower sub-patterns 122y may be surrounded by the first insulating layer 114A, and the first upper sub-patterns 124x and the second upper sub-patterns 124y may be surrounded by the second insulating layer 114B.

The first outer fence 226 may include the third fence segment SE3 and the fourth fence segment SE4, and the third fence segment SE3 and the fourth fence segment SE4 may be surrounded by the third insulating layer 114C and the fourth insulating layer 114D, respectively. The first outer fence 226 may be spaced apart from, and thus may not penetrate, the first insulating layer 114A. Likewise, the first inner fence 228 may include the third fence segment SE3 and the fourth fence segment SE4, and the third fence segment SE3 and the fourth fence segment SE4 may be surrounded by the third insulating layer 114C and the fourth insulating layer 114D, respectively.

The second overlay pattern structure OLP2 may include the second overlay pattern group OPG2, the second outer fence 236, and the second inner fence 238. The second outer fence 236 and the second inner fence 238 may be arranged at different vertical levels from the second overlay pattern group OPG2.

For example, the third lower sub-patterns 132x and the fourth lower sub-patterns 132y may be arranged at the same vertical level as the second wire layer ML2, and the third upper sub-patterns 134x and the fourth upper sub-patterns 134y may be arranged at the same vertical level as the second wire contact MLC2. The third lower sub-patterns 132x and the fourth lower sub-patterns 132y may be surrounded by the third insulating layer 114C, and the third upper sub-patterns 134x and the fourth upper sub-patterns 134y may be surrounded by the fourth insulating layer 114D.

The second outer fence 236 may include the first fence segment SE1 and the second fence segment SE2, and the first fence segment SE1 and the second fence segment SE2 may be respectively surrounded by the first insulating layer 114A and the second insulating layer 114B.

Likewise, the second inner fence 238 may include the first fence segment SE1 and the second fence segment SE2, and the first fence segment SE1 and the second fence segment SE2 may be respectively surrounded by the first insulating layer 114A and the second insulating layer 114B.

As illustrated in FIG. 15, at the first vertical level LV1 in the first overlay pattern region OLR1, the first overlay pattern group OPG1 and the first insulating layer 114A may be arranged, and the first outer fence 226 surrounding the first overlay pattern region OLR1 may not be arranged.

As illustrated in FIG. 16, at the second vertical level LV2 in the second overlay pattern region OLR2, the second overlay pattern group OPG2 and the third insulating layer 114C may be arranged, and the second outer fence 236 surrounding the second overlay pattern region OLR2 may not be arranged.

In example embodiments, as the first overlay pattern group OPG1 is arranged at a different vertical level from the first outer fence 226 and the first inner fence 228, a difference between a pattern density in a process of forming the first overlay pattern group OPG1 at the first vertical level LV1 and a pattern density in a process of forming the first outer fence 226 and the first inner fence 228 at the second vertical level LV2 may relatively decrease. Likewise, as the second overlay pattern group OPG2 is arranged at a different vertical level from the second outer fence 236 and the second inner fence 238, a difference between a pattern density in a process of forming the second outer fence 236 and the second inner fence 238 at the first vertical level LV1 and a pattern density in a process of forming the second overlay pattern group OPG2 at the second vertical level LV2 may relatively decrease. Therefore, the upper surface flatness around the first overlay pattern group OPG1 and the second overlay pattern group OPG2 on the scribe lanes SL may be improved.

In the alignment key regions AKR, the first alignment key structure AKP1 may include first alignment key patterns 242, a first alignment key outer fence 246, and a first alignment key inner fence 248, and the second alignment key structure AKP2 may include second alignment key patterns 252, a second alignment key outer fence 256, and a second alignment key inner fence 258.

The first alignment key patterns 242 may extend in the first direction X and may be arranged (spaced apart) in parallel with each other in the second direction Y. The first alignment key patterns 242 may be surrounded by the first insulating layer 114A, and in the plan view, the first alignment key outer fence 246 surrounds the first alignment key patterns 242 and defines the first alignment key region AKR1. The first alignment key inner fence 248 may be arranged in the first alignment key region AKR1 and may divide the first alignment key region AKR1 into a plurality of first alignment key sub-regions AKR1_S.

The second alignment key pattern 252 may extend in the first direction X and may be arranged (spaced apart) in parallel with each other in the second direction Y. The second alignment key pattern 252 may be arranged at a different vertical level from the first alignment key patterns 242. For example, the second alignment key patterns 252 may be surrounded by the third insulating layer 114C. In the plan view, the second alignment key outer fence 256 may surround the second alignment key patterns 252 and may define the second alignment key region AKR2. The second alignment key inner fence 258 may be in the second alignment key region AKR2 and may divide the second alignment key region AKR2 into a plurality of second alignment key sub-regions AKR2_S.

In example embodiments, as illustrated in FIGS. 18 and 19, the first alignment key outer fence 246 and the first alignment key inner fence 248 may be arranged at different vertical levels from the first alignment key patterns 242, and the second alignment key outer fence 256 and the second alignment key inner fence 258 may be arranged at different vertical levels from the second alignment key patterns 252.

Figure 20:
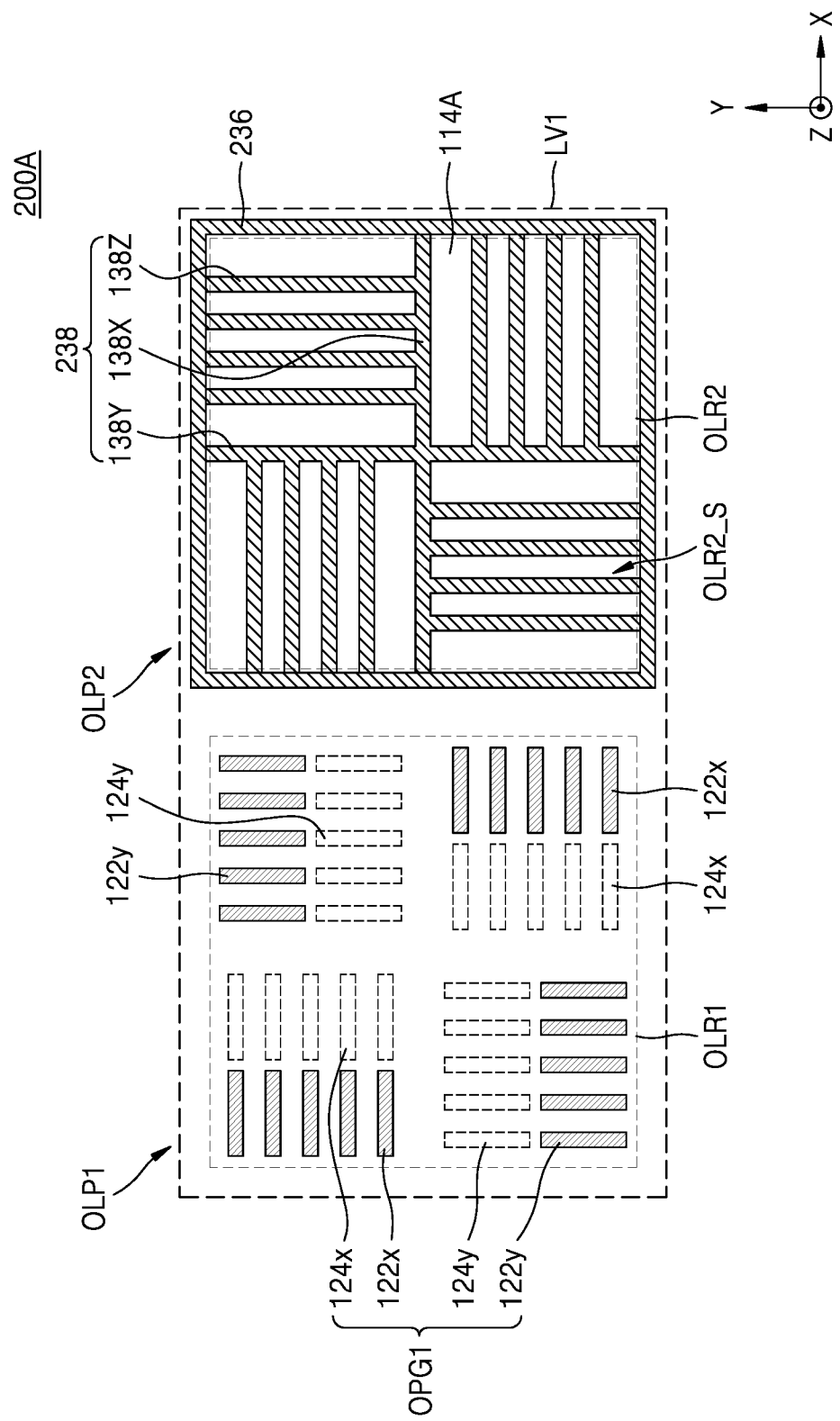
FIGS. 20 and 21 are horizontal cross-sectional views of a semiconductor device according to example embodiments.
Figure 21:
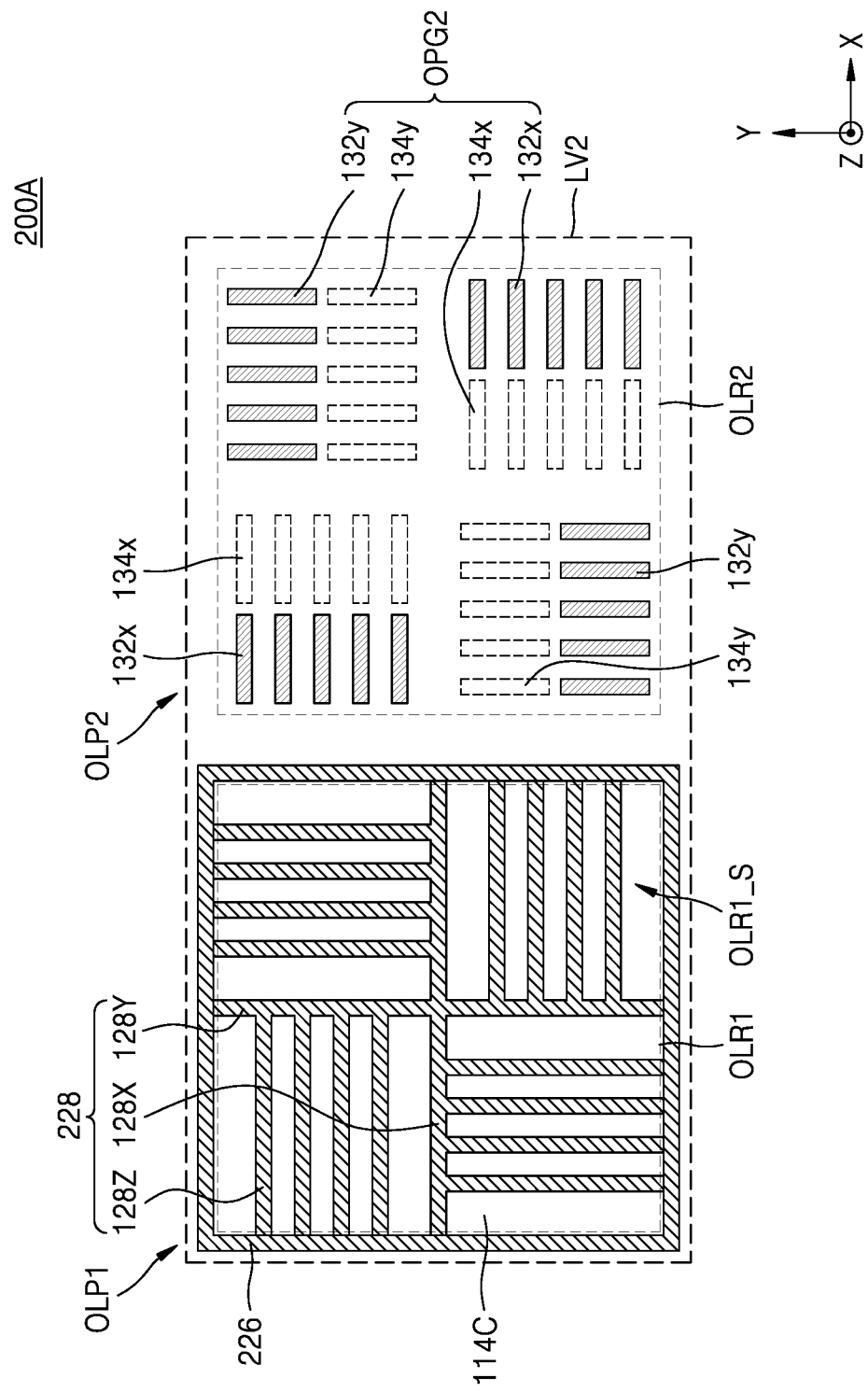

FIGS. 20 and 21 are horizontal cross-sectional views of a semiconductor device 200A according to example embodiments. FIG. 20 is a horizontal cross-sectional view corresponding to a horizontal cross-section at a first vertical level LV1, and FIG. 21 is a horizontal cross-sectional view corresponding to a horizontal cross-section at a second vertical level LV2.

Referring to FIGS. 20 and 21, the first inner fence 228 may include the first line segment 128X, which passes through the central portion of the first overlay pattern region OLR1 and extends in the first direction X, and the second line segment 128Y, which passes through the central portion of the first overlay pattern region OLR1 and extends in the second direction Y, and may further include third line segments 128Z, which bisect four sub-regions defined by the first line segment 128X, the second line segment 128Y, and the first outer fence 226.

As illustrated in FIGS. 20 and 21, the third line segments 128Z may vertically overlap a region between two first lower sub-patterns 122x, which are adjacent to each other from among the first lower sub-patterns 122x, and a region between two first upper sub-patterns 124x, which are adjacent to each other from among the first upper sub-patterns 124x. Also, the third line segments 128Z may vertically overlap a region between two second lower sub-patterns 122y, which are adjacent to each other from among the second lower sub-patterns 122y, and a region between two second upper sub-patterns 124y, which are adjacent to each other from among the second upper sub-patterns 124y. In other words, in the plan view, one first lower sub-pattern 122x and one first upper sub-pattern 124x may be arranged between two third line segments 128Z, which are adjacent to each other from among the third line segments 128Z, and one second lower sub-pattern 122y and one second upper sub-pattern 124y may be arranged between two third line segments 128Z, which are adjacent to each other. Therefore, the first inner fence 228 may be formed as a reverse pattern of the first overlay pattern group OPG1. Likewise, the second inner fence 238 may be formed as a reverse pattern of the second alignment key pattern group OPG2.

Figure 22:
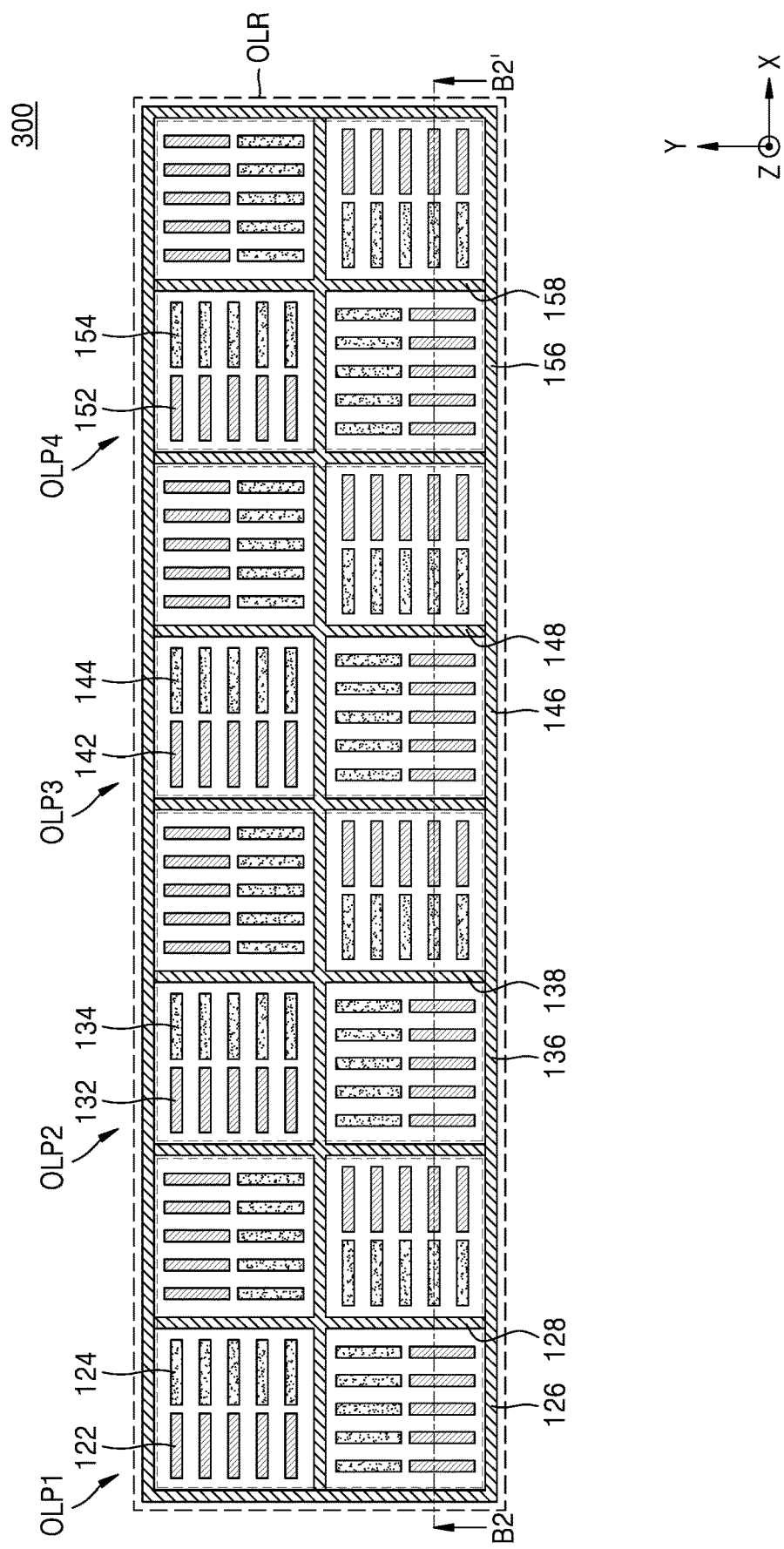
FIG. 22 is a layout of a semiconductor device according to example embodiments.
Figure 23:
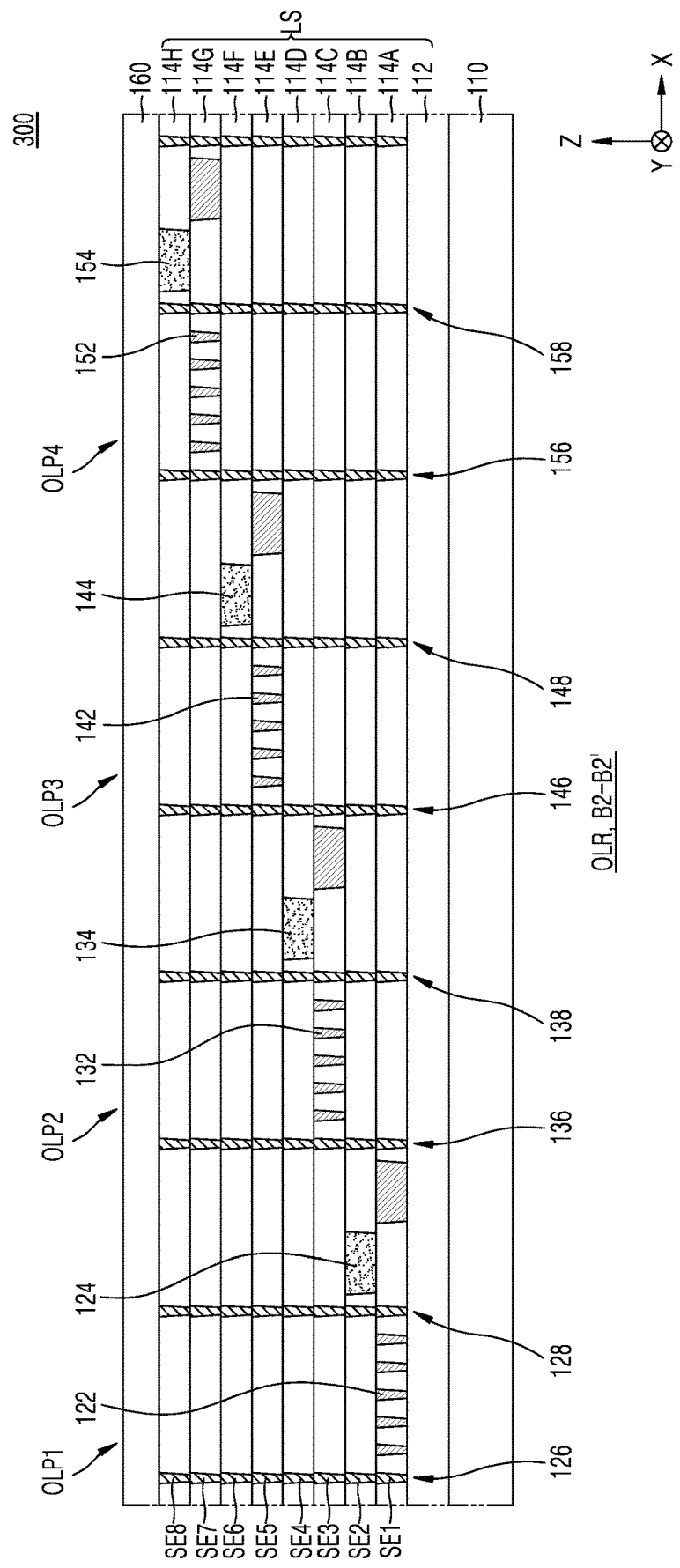
FIG. 23 is a cross-sectional view taken along a line B2-B2' of FIG. 22.

FIG. 22 is a layout illustrating a semiconductor device 300 according to example embodiments. FIG. 23 is a cross-sectional view taken along a line B2-B2' of FIG. 22.

Referring to FIGS. 22 and 23, in the overlay pattern region OLR, the first overlay pattern structure OLP1, the second overlay pattern structure OLP2, the third overlay pattern structure OLP3, and the fourth overlay pattern structure OLP4 may be adjacent to each other. The first to fourth overlay pattern structures OLP1 to OLP4 may be surrounded by first to eighth insulating layers 114A to 114H. In example embodiments, the first to fourth overlay pattern structures OLP1 to OLP4 may be used as overlay patterns during a photolithography process of forming the first wire layer ML1 (see FIG. 3), the second wire layer ML2 (see FIG. 3), a third wire layer (not illustrated), and a fourth wire layer (not illustrated). Although not illustrated, the third and fourth wire layers may be arranged at higher vertical levels than the second wire layer ML2 in the circuit region ICR included in the cell region CHR.

The first overlay pattern structure OLP1 may include a first lower pattern 122 surrounded by the first insulating layer 114A, a first upper pattern 124 surrounded by the second insulating layer 114B, the first outer fence 126 penetrating the first to eighth insulating layers 114A to 114H, and the first inner fence 128 penetrating the first to eighth insulating layers 114A to 114H. The first lower pattern 122 may include the first lower sub-pattern 122x (see FIG. 4) and the second lower sub-pattern 122y (see FIG. 4) described with reference to FIGS. 4 and 5, and the first upper pattern 124 may include the first upper sub-pattern 124x (see FIG. 4) and the second upper sub-pattern 124y (see FIG. 4) described with reference to FIGS. 4 and 5.

The second overlay pattern structure OLP2 may include a second lower pattern 132 surrounded by the third insulating layer 114C, a second upper pattern 134 surrounded by the fourth insulating layer 114D, the second outer fence 136 penetrating the first to eighth insulating layers 114A to 114H, and the second inner fence 138 penetrating the first to eighth insulating layers 114A to 114H. The third overlay pattern structure OLP3 may include a third lower pattern 142 surrounded by the fifth insulating layer 114E, a third upper pattern 144 surrounded by the sixth insulating layer 114F, the third outer fence 146 penetrating the first to eighth insulating layers 114A to 114H, and the third inner fence 148 penetrating the first to eighth insulating layers 114A to 114H. The fourth overlay pattern structure OLP4 may include a fourth lower pattern 152 surrounded by the seventh insulating layer 114G, a fourth upper pattern 154 surrounded by the eighth insulating layer 114H, and the fourth outer fence 156 penetrating the first to eighth insulating layers 114A to 114H, and the fourth inner fence 158 penetrating the first to eighth insulating layers 114A to 114H.

As illustrated in FIG. 23, the first to fourth outer fences 126, 136, 146, and 156 and the first to fourth inner fences 128, 138, 148, and 158 may each include fence segments SE1 to SE8 stacked in a direction perpendicular to the upper surface of the substrate 110.

According to the one or more embodiments, the first and second overlay pattern groups OPG1 and OPG2 include both sub-patterns extending in the first direction and sub-patterns extending in the second direction. In other embodiments, however, the first and second overlay pattern groups OPG1 and OPG2 may only include patterns extending in the first direction, patterns extending in the second direction, or patterns extending in an arbitrary direction. According to other embodiments, the first and second overlay pattern groups OPG1 and OPG2 may include patterns having arbitrary shapes, for example, a combination of at least two lines, a plug, a pillar, or a feature such as a polygonal shape, instead of including sub-patterns having a line and space shape.

Also, according to the one or more embodiments, the first to fourth overlay pattern structures OLP1, OLP2, OLP3, and OLP4 formed on the scribe lanes SL surrounding the cell region CHR (or a chip region) are described, but according to other embodiments, the first to fourth overlay pattern structures OLP1, OLP2, OLP3, and OLP4 may be arranged together in some portions of the cell region CHR.

While the inventive concept has been particularly shown and described with reference to embodiments thereof, it will be understood that various changes in form and details may be made therein without departing from the scope of the following claims.

What is claimed is:

1. A semiconductor device comprising:
   a substrate comprising a cell region and a scribe lane surrounding the cell region;
   a first overlay pattern structure on the scribe lane, wherein the first overlay pattern structure comprises:
      a plurality of first sub-patterns extending in a first direction parallel to an upper surface of the substrate;
      a plurality of second sub-patterns extending in a second direction parallel to the upper surface of the substrate;
      a first outer fence surrounding the plurality of first sub-patterns and the plurality of second sub-patterns in a plan view and defining a first overlay pattern region; and
      a first inner fence in the first overlay pattern region and between the plurality of first sub-patterns and the plurality of second sub-patterns; and
   a lower structure in the cell region and on the scribe lane and between the plurality of first sub-patterns, the plurality of second sub-patterns, the first outer fence, and the first inner fence.

2. The semiconductor device of claim 1, wherein the first outer fence comprises:
   a first outer fence segment having an upper surface that is coplanar with an upper surface of a sub-pattern of the plurality of first sub-patterns; and
   a second outer fence segment on the first outer fence segment.

3. The semiconductor device of claim 2, wherein the first inner fence comprises:
   a first inner fence segment having an upper surface that is coplanar with the upper surface of the sub-pattern of the plurality of first sub-patterns; and
   a second inner fence segment on the first inner fence segment.

4. The semiconductor device of claim 3,
   wherein the lower structure comprises:
      a first insulating layer on a side wall of the first outer fence segment and a side wall of the first inner fence segment; and
      a second insulating layer on the first insulating layer, a side wall of the second outer fence segment, and a side wall of the second inner fence segment, and
   wherein the first outer fence penetrates the first insulating layer and the second insulating layer and extends in a third direction perpendicular to the upper surface of the substrate.

5. The semiconductor device of claim 1,
   wherein the first outer fence comprises an outer fence segment having an upper surface at a higher level than an upper surface of a sub-pattern of the plurality of first sub-patterns, and
   wherein the first inner fence comprises an inner fence segment having an upper surface at a higher level than the upper surface of the sub-pattern of the plurality of first sub-patterns.

6. The semiconductor device of claim 5,
   wherein the lower structure comprises:
      a first insulating layer on side walls of the plurality of first sub-patterns and the plurality of second sub-patterns; and
      a second insulating layer on the first insulating layer, a side wall of the outer fence segment, and a side wall of the inner fence segment, and
   wherein the first outer fence is spaced apart from the first insulating layer.

7. The semiconductor device of claim 1, wherein, in the plan view, the first inner fence quadrisects the first overlay pattern region into four sub-regions.

8. The semiconductor device of claim 1, wherein, in the plan view, the first inner fence divides the first overlay pattern region into eight sub-regions.

9. The semiconductor device of claim 1, wherein, in the plan view, the first inner fence divides the first overlay pattern region into two sub-regions.

10. The semiconductor device of claim 1, further comprising
    a second overlay pattern structure on the scribe lane and adjacent to the first overlay pattern structure, the second overlay pattern structure comprising:
       a plurality of third sub-patterns extending in the first direction;
       a plurality of fourth sub-patterns extending in the second direction;
       a second outer fence surrounding the plurality of third sub-patterns and the plurality of fourth sub-patterns in the plan view and defining a second overlay pattern region; and
       a second inner fence in the second overlay pattern region and between the plurality of third sub-patterns and the plurality of fourth sub-patterns.

11. The semiconductor device of claim 10,
    wherein the plurality of third sub-patterns have upper surfaces at higher levels than upper surfaces of the plurality of first sub-patterns, and
    wherein the second outer fence has an upper surface that is coplanar with an upper surface of the first outer fence.

12. The semiconductor device of claim 10,
    wherein the lower structure comprises:
       a first insulating layer on side walls of the plurality of first sub-patterns and the plurality of second sub-patterns; and
       a second insulating layer on the first insulating layer and on side walls of the plurality of third sub-patterns and the plurality of fourth sub-patterns, and
    wherein the second outer fence penetrates the first insulating layer and the second insulating layer and extends in a third direction perpendicular to the upper surface of the substrate.

13. A semiconductor device comprising:
    a substrate comprising a cell region and a scribe lane surrounding the cell region;
    a lower structure in the cell region and on the scribe lane and comprising a first insulating layer and a second insulating layer on the first insulating layer;
    a first overlay pattern structure on the scribe lane, wherein the first overlay pattern structure comprises:
       a plurality of first overlay patterns extending in a first direction parallel to an upper surface of the substrate and spaced apart from each other in a second direction parallel to the upper surface of the substrate; and
       a first outer fence surrounding the plurality of first overlay patterns in a plan view, defining a first overlay pattern region, penetrating the first and second insulating layers, and extending in a third direction perpendicular to the upper surface of the substrate; and a second overlay pattern structure on the scribe lane, wherein the second overlay pattern structure comprises:
- a plurality of second overlay patterns extending in the first direction parallel to the upper surface of the substrate and spaced apart from each other in the second direction; and
- a second outer fence surrounding the plurality of second overlay patterns in the plan view, defining a second overlay pattern region, penetrating the first and second insulating layers, and extending in the third direction.

14. The semiconductor device of claim 13,
wherein side walls of the plurality of first overlay patterns are surrounded by the first insulating layer, and
wherein side walls of the plurality of second overlay patterns are surrounded by the second insulating layer.

15. The semiconductor device of claim 13,
wherein the first overlay pattern structure further comprises a first inner fence in the first overlay pattern region, penetrating the first and second insulating layers, and extending in the third direction, and
wherein the second overlay pattern structure further comprises a second inner fence in the second overlay pattern region, penetrating the first and second insulating layers, and extending in the third direction.

16. The semiconductor device of claim 15,
wherein the first outer fence comprises:
- a first outer fence segment penetrating the first insulating layer; and
- a second outer fence segment penetrating the second insulating layer, wherein the first inner fence comprises:
- a first inner fence segment penetrating the first insulating layer; and
- a second inner fence segment penetrating the second insulating layer, and wherein the first outer fence and the first inner fence have upper surfaces at higher levels than upper surfaces of the plurality of first overlay patterns.

17. A semiconductor device comprising:
a substrate comprising a cell region and a scribe lane surrounding the cell region;
a peripheral circuit transistor in the cell region;
a lower structure on the peripheral circuit transistor in the cell region and on the scribe lane and comprising a first insulating layer and a second insulating layer on the first insulating layer;
a memory cell array on the lower structure in the cell region;
a first overlay pattern structure on the scribe lane, wherein the first overlay pattern structure comprises:
- a plurality of first overlay patterns extending in a first direction parallel to an upper surface of the substrate and spaced apart from each other in a second direction parallel to the upper surface of the substrate; and
- a first outer fence surrounding the plurality of first overlay patterns in a plan view, defining a first overlay pattern region, penetrating the first and second insulating layers, and extending in a third direction perpendicular to the upper surface of the substrate; and a second overlay pattern structure on the scribe lane, wherein the second overlay pattern structure comprises:
- a plurality of second overlay patterns extending in the first direction parallel to the upper surface of the substrate and spaced apart from each other in the second direction; and
- a second outer fence surrounding the plurality of second overlay patterns in the plan view, defining a second overlay pattern region, penetrating the first and second insulating layers, and extending in the third direction.

18. The semiconductor device of claim 17,
wherein side walls of the plurality of first overlay patterns are surrounded by the first insulating layer, and
wherein side walls of the plurality of second overlay patterns are surrounded by the second insulating layer.

19. The semiconductor device of claim 18, further comprising:
a first wire layer at a first vertical level and electrically connected to the peripheral circuit transistor; and
a second wire layer at a second vertical level higher than the first vertical level,
wherein a side wall of the first wire layer is surrounded by the first insulating layer, and
wherein a side wall of the second wire layer is surrounded by the second insulating layer.

20. The semiconductor device of claim 19,
wherein an upper surface of the first wire layer is coplanar with upper surfaces of the plurality of first overlay patterns, and
wherein an upper surface of the second wire layer is coplanar with upper surfaces of the plurality of second overlay patterns.

* * * * *